(12) United States Patent
Jiang et al.

(10) Patent No.: US 8,199,123 B2
(45) Date of Patent: Jun. 12, 2012

(54) METHOD FOR MAKING LIQUID CRYSTAL DISPLAY SCREEN

(75) Inventors: Kai-Li Jiang, Beijing (CN); Liang Liu, Beijing (CN); Shou-Shan Fan, Beijing (CN); Ga-Lane Chen, Santa-Clara, CA (US); Jia-Shyong Cheng, Tu-Cheng (TW); Jeah-Sheng Wu, Tu-Cheng (TW)

(73) Assignees: Tsinghua University, Beijing (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 209 days.

(21) Appl. No.: 12/584,410

(22) Filed: Sep. 3, 2009

(65) Prior Publication Data
US 2010/0093117 A1    Apr. 15, 2010

Related U.S. Application Data

(63) Continuation of application No. 12/459,566, filed on Jul. 2, 2009.

(30) Foreign Application Priority Data

| Jul. 4, 2008 | (CN) | 2008 1 0068315 |
| Jul. 4, 2008 | (CN) | 2008 1 0068316 |
| Jul. 4, 2008 | (CN) | 2008 1 0068317 |
| Jul. 4, 2008 | (CN) | 2008 1 0068318 |
| Jul. 4, 2008 | (CN) | 2008 1 0068319 |
| Jul. 9, 2008 | (CN) | 2008 1 0068371 |
| Feb. 20, 2009 | (CN) | 2009 1 0004619 |

(51) Int. Cl.
*G06F 3/041* (2006.01)

(52) U.S. Cl. ..... 345/173; 428/364; 427/99.2; 178/18.05
(58) Field of Classification Search ................ 438/25; 345/173–174; 428/364; 427/99.2; 178/18.05
See application file for complete search history.

(56) References Cited

U.S. PATENT DOCUMENTS

| 4,659,873 A | 4/1987 | Gibson et al. |
| 4,922,061 A | 5/1990 | Meadows et al. |

(Continued)

FOREIGN PATENT DOCUMENTS

CN    2539375    3/2003

(Continued)

OTHER PUBLICATIONS

Kai-Li Jiang, Qun-Qing Li, Shou-Shan Fan, "Continuous carbon nanotube yarns and their applications", Physics, China, pp. 506-510, Aug. 31, 2003,32(8)(lines from the 4th line to 35th line in the right column of p. 507 may be relevant).

(Continued)

*Primary Examiner* — Peter Macchiarolo
*Assistant Examiner* — Mary Ellen Bowman
(74) *Attorney, Agent, or Firm* — Altis Law Group, Inc.

(57) ABSTRACT

A method for making a liquid crystal display screen is provided. The method includes the following steps. A touch panel and a thin film transistor panel are provided, and the touch panel includes at least one TP carbon nanotube layer. The thin film transistor panel includes a plurality of thin film transistors; each of the thin film transistors comprises a TFT carbon nanotube layer. A first polarizer is applied on a surface of the touch panel. Additionally, a liquid crystal layer is provided to be placed between the first polarizer and the thin film transistor panel.

15 Claims, 22 Drawing Sheets

U.S. PATENT DOCUMENTS

| | | | |
|---|---|---|---|
| 4,933,660 A | 6/1990 | Wynne, Jr. | |
| 5,181,030 A | 1/1993 | Itaya et al. | |
| 5,853,877 A | 12/1998 | Shibuta | |
| 5,861,583 A | 1/1999 | Schediwy et al. | |
| 6,373,472 B1 | 4/2002 | Palalau et al. | |
| 6,423,583 B1 | 7/2002 | Avouris et al. | |
| 6,628,269 B2 | 9/2003 | Shimizu | |
| 6,629,833 B1 | 10/2003 | Ohya et al. | |
| 6,914,640 B2 | 7/2005 | Yu | |
| 6,947,203 B2 | 9/2005 | Kanbe | |
| 7,054,064 B2 | 5/2006 | Jiang et al. | |
| 7,060,241 B2 | 6/2006 | Glatkowski | |
| 7,084,933 B2 | 8/2006 | Oh et al. | |
| 7,196,463 B2 | 3/2007 | Okai et al. | |
| 7,215,329 B2 | 5/2007 | Yoshikawa et al. | |
| 7,242,136 B2 | 7/2007 | Kim et al. | |
| 7,336,261 B2 | 2/2008 | Yu | |
| 7,348,966 B2 | 3/2008 | Hong et al. | |
| 7,399,400 B2 | 7/2008 | Soundarrajan et al. | |
| 7,532,182 B2 | 5/2009 | Tseng et al. | |
| 7,537,975 B2 | 5/2009 | Moon et al. | |
| 7,593,004 B2 | 9/2009 | Spath et al. | |
| 7,630,040 B2 | 12/2009 | Liu et al. | |
| 7,662,732 B2 | 2/2010 | Choi et al. | |
| 7,663,607 B2 | 2/2010 | Hotelling et al. | |
| 7,704,480 B2 | 4/2010 | Jiang et al. | |
| 7,710,649 B2 | 5/2010 | Feng et al. | |
| 7,796,123 B1 | 9/2010 | Irvin, Jr. et al. | |
| 7,825,911 B2 | 11/2010 | Sano et al. | |
| 7,854,992 B2 | 12/2010 | Fu et al. | |
| 7,947,977 B2 | 5/2011 | Jiang et al. | |
| 2002/0089492 A1 | 7/2002 | Ahn et al. | |
| 2003/0122800 A1 | 7/2003 | Yu | |
| 2003/0147041 A1 | 8/2003 | Oh et al. | |
| 2004/0047038 A1 | 3/2004 | Jiang et al. | |
| 2004/0053780 A1 | 3/2004 | Jiang et al. | |
| 2004/0099438 A1 | 5/2004 | Arthur et al. | |
| 2004/0105040 A1 | 6/2004 | Oh et al. | |
| 2004/0136896 A1 | 7/2004 | Liu et al. | |
| 2004/0191157 A1 | 9/2004 | Harutyunyan et al. | |
| 2004/0251504 A1 | 12/2004 | Noda | |
| 2005/0110720 A1 | 5/2005 | Akimoto et al. | |
| 2005/0151195 A1 | 7/2005 | Kawase et al. | |
| 2005/0205880 A1* | 9/2005 | Anzai et al. | 257/83 |
| 2005/0209392 A1* | 9/2005 | Luo et al. | 524/496 |
| 2006/0010996 A1* | 1/2006 | Jordan et al. | 73/866.1 |
| 2006/0022221 A1* | 2/2006 | Furukawa et al. | 257/222 |
| 2006/0044284 A1* | 3/2006 | Tanabe | 345/173 |
| 2006/0077147 A1 | 4/2006 | Palmateer et al. | |
| 2006/0097991 A1 | 5/2006 | Hotelling et al. | |
| 2006/0171032 A1 | 8/2006 | Nishioka | |
| 2006/0187213 A1 | 8/2006 | Su | |
| 2006/0188721 A1 | 8/2006 | Irvin et al. | |
| 2006/0213251 A1 | 9/2006 | Rinzler et al. | |
| 2006/0240605 A1* | 10/2006 | Moon et al. | 438/149 |
| 2006/0262055 A1 | 11/2006 | Takahara | |
| 2006/0263588 A1 | 11/2006 | Handa et al. | |
| 2006/0274047 A1 | 12/2006 | Spath et al. | |
| 2006/0274048 A1* | 12/2006 | Spath et al. | 345/173 |
| 2006/0274049 A1 | 12/2006 | Spath et al. | |
| 2006/0275956 A1 | 12/2006 | Konesky | |
| 2006/0278444 A1 | 12/2006 | Binstead | |
| 2007/0065651 A1 | 3/2007 | Glatkowski et al. | |
| 2007/0069212 A1 | 3/2007 | Saitoh et al. | |
| 2007/0075619 A1 | 4/2007 | Jiang et al. | |
| 2007/0081681 A1 | 4/2007 | Yu et al. | |
| 2007/0085460 A1* | 4/2007 | Harutyunyan et al. | 313/309 |
| 2007/0099333 A1 | 5/2007 | Moriya | |
| 2007/0132953 A1 | 6/2007 | Silverstein | |
| 2007/0165004 A1 | 7/2007 | Seelhammer et al. | |
| 2007/0182720 A1 | 8/2007 | Fujii et al. | |
| 2007/0215041 A1 | 9/2007 | Ford et al. | |
| 2007/0257894 A1 | 11/2007 | Philipp | |
| 2007/0262687 A1 | 11/2007 | Li | |
| 2007/0273796 A1 | 11/2007 | Silverstein et al. | |
| 2007/0273797 A1 | 11/2007 | Silverstein et al. | |
| 2007/0273798 A1 | 11/2007 | Silverstein et al. | |
| 2007/0279556 A1 | 12/2007 | Wang et al. | |
| 2007/0296897 A1* | 12/2007 | Liu et al. | 349/123 |
| 2007/0298253 A1 | 12/2007 | Hata et al. | |
| 2008/0029292 A1 | 2/2008 | Takayama et al. | |
| 2008/0088219 A1 | 4/2008 | Yoon et al. | |
| 2008/0129666 A1 | 6/2008 | Shimotono et al. | |
| 2008/0138589 A1 | 6/2008 | Wakabayashi et al. | |
| 2008/0192014 A1 | 8/2008 | Kent et al. | |
| 2008/0238882 A1 | 10/2008 | Sivarajan et al. | |
| 2008/0252202 A1 | 10/2008 | Li et al. | |
| 2008/0266273 A1 | 10/2008 | Slobodin et al. | |
| 2008/0277718 A1 | 11/2008 | Ionescu et al. | |
| 2009/0032777 A1 | 2/2009 | Kitano et al. | |
| 2009/0056854 A1 | 3/2009 | Oh et al. | |
| 2009/0059151 A1 | 3/2009 | Kim et al. | |
| 2009/0101488 A1 | 4/2009 | Jiang et al. | |
| 2009/0153511 A1 | 6/2009 | Jiang et al. | |
| 2009/0208708 A1 | 8/2009 | Wei et al. | |
| 2009/0283211 A1 | 11/2009 | Matsuhira | |
| 2009/0293631 A1 | 12/2009 | Radivojevic | |
| 2010/0001972 A1 | 1/2010 | Jiang et al. | |
| 2010/0001976 A1 | 1/2010 | Jiang et al. | |
| 2010/0007619 A1 | 1/2010 | Jiang et al. | |
| 2010/0007624 A1 | 1/2010 | Jiang et al. | |
| 2010/0007625 A1 | 1/2010 | Jiang et al. | |
| 2010/0065788 A1 | 3/2010 | Momose et al. | |
| 2010/0078067 A1 | 4/2010 | Jia et al. | |
| 2010/0093247 A1 | 4/2010 | Jiang et al. | |
| 2010/0171099 A1 | 7/2010 | Tombler, Jr. et al. | |
| 2010/0271330 A1 | 10/2010 | Philipp | |
| 2011/0032196 A1 | 2/2011 | Feng et al. | |

FOREIGN PATENT DOCUMENTS

| | | |
|---|---|---|
| CN | 1447279 | 10/2003 |
| CN | 1447279 A | 10/2003 |
| CN | 1482472 | 3/2004 |
| CN | 1483667 | 3/2004 |
| CN | 1484865 | 3/2004 |
| CN | 1501317 | 6/2004 |
| CN | 1503195 | 6/2004 |
| CN | 1509982 | 7/2004 |
| CN | 1519196 | 8/2004 |
| CN | 2638143 | 9/2004 |
| CN | 1543399 | 11/2004 |
| CN | 1543399 A | 11/2004 |
| CN | 1671481 | 9/2005 |
| CN | 1675580 | 9/2005 |
| CN | 1690915 A | 11/2005 |
| CN | 1738018 | 2/2006 |
| CN | 1744021 A | 3/2006 |
| CN | 1745302 | 3/2006 |
| CN | 1803594 | 7/2006 |
| CN | 1823320 | 8/2006 |
| CN | 1292292 C | 12/2006 |
| CN | 2844974 Y | 12/2006 |
| CN | 1903793 | 1/2007 |
| CN | 1942853 | 4/2007 |
| CN | 1947203 | 4/2007 |
| CN | 1948144 | 4/2007 |
| CN | 1315362 | 5/2007 |
| CN | 1982209 | 6/2007 |
| CN | 1996620 | 7/2007 |
| CN | 1998067 | 7/2007 |
| CN | 101017417 | 8/2007 |
| CN | 101059738 | 10/2007 |
| CN | 101165883 | 4/2008 |
| DE | 202007006407 | 9/2007 |
| EP | 1739692 | 1/2007 |
| JP | S61-231626 | 10/1986 |
| JP | S62-63332 | 3/1987 |
| JP | S62-182916 | 8/1987 |
| JP | S62-190524 | 8/1987 |
| JP | H2-8926 | 1/1990 |
| JP | 1991-54624 | 3/1991 |
| JP | H3-54624 | 3/1991 |
| JP | 5-53715 | 3/1993 |
| JP | H06-28090 | 2/1994 |
| JP | H6-67788 | 3/1994 |
| JP | 8-287775 | 11/1996 |
| JP | H10-63404 | 3/1998 |

| | | |
|---|---|---|
| JP | 2001-34419 | 2/2001 |
| JP | 2001-267782 | 9/2001 |
| JP | 2002-278701 | 9/2002 |
| JP | 2003-99192 | 4/2003 |
| JP | 2003-99193 | 4/2003 |
| JP | 2003-288164 | 10/2003 |
| JP | 2004-26532 | 1/2004 |
| JP | 2004-102217 | 4/2004 |
| JP | 2004-189573 | 7/2004 |
| JP | 2004-253796 | 9/2004 |
| JP | 2004-266272 | 9/2004 |
| JP | 2005-67976 | 3/2005 |
| JP | 2005-85485 | 3/2005 |
| JP | 2005-176428 | 6/2005 |
| JP | 2005-182339 | 7/2005 |
| JP | 2005-222182 | 8/2005 |
| JP | 2006-171336 | 6/2006 |
| JP | 2006-228818 | 8/2006 |
| JP | 2006-243455 | 9/2006 |
| JP | 2006-521998 | 9/2006 |
| JP | 2006-269311 | 10/2006 |
| JP | 2006-285068 | 10/2006 |
| JP | 2007-11997 | 1/2007 |
| JP | 2007-31238 | 2/2007 |
| JP | 2007-73706 | 3/2007 |
| JP | 2007-112133 | 5/2007 |
| JP | 2007-123870 | 5/2007 |
| JP | 2007-161563 | 6/2007 |
| JP | 2007-161576 | 6/2007 |
| JP | 2007-182357 | 7/2007 |
| JP | 2007-229989 | 9/2007 |
| JP | 2007-299409 | 11/2007 |
| JP | 2007-310869 | 11/2007 |
| JP | 2008-139711 | 6/2008 |
| JP | 2008-536710 | 9/2008 |
| JP | 2008-542953 | 11/2008 |
| JP | 2009-104577 | 5/2009 |
| KR | 0525731 | 11/2005 |
| KR | 20060129977 | 12/2006 |
| KR | 20070012414 | 1/2007 |
| KR | 20070081902 | 8/2007 |
| KR | 2007-0108077 | 11/2007 |
| TW | 131955 | 4/1990 |
| TW | 341684 | 10/1998 |
| TW | 242732 | 9/2004 |
| TW | 200518195 | 6/2005 |
| TW | I233570 | 6/2005 |
| TW | 200522366 | 7/2005 |
| TW | 284963 | 1/2006 |
| TW | I249134 | 2/2006 |
| TW | I249708 | 2/2006 |
| TW | I251710 | 3/2006 |
| TW | I253846 | 4/2006 |
| TW | 200622432 | 7/2006 |
| TW | I267014 | 11/2006 |
| TW | M306694 | 2/2007 |
| TW | 200710493 | 3/2007 |
| TW | 200713337 | 4/2007 |
| TW | 200717083 | 5/2007 |
| TW | 200719198 | 5/2007 |
| TW | 200722559 | 6/2007 |
| TW | 284927 | 8/2007 |
| TW | 200729241 | 8/2007 |
| TW | 200737414 | 10/2007 |
| TW | 200738558 | 10/2007 |
| WO | WO02076724 | 10/2002 |
| WO | WO02076724 A1 | 10/2002 |
| WO | WO2004019119 | 3/2004 |
| WO | WO2004052559 | 6/2004 |
| WO | WO2004114105 | 12/2004 |
| WO | WO2005104141 | 11/2005 |
| WO | WO2006003245 | 1/2006 |
| WO | WO2006014241 | 2/2006 |
| WO | WO2006030981 | 3/2006 |
| WO | WO2006031981 | 3/2006 |
| WO | WO2006120803 | 11/2006 |
| WO | WO2006126604 | 11/2006 |
| WO | WO2006130366 | 12/2006 |
| WO | WO2007008518 | 1/2007 |
| WO | 2007012899 | 2/2007 |
| WO | 2007022226 | 2/2007 |
| WO | WO2007063751 | 6/2007 |
| WO | WO2007066649 | 6/2007 |
| WO | WO2007099975 | 9/2007 |

OTHER PUBLICATIONS

Kazuhiro Noda, Kohtaro Tanimura, Production of Transparent Conductive Films with Inserted SiO2 Anchor Layer, and Application to a Resistive Touch Panel, Electronics and Communications in Japan, No. 7, 2001, pp. 39-45, vol. 84.

Yoshikazu Nakayama, "Technology Development of CNT Long Yarns and CNT Sheets", Nano Carbon Handbook, Japan TSN Inc, pp. 261-266, Jul. 17, 2007(the First 6 Sentences of 2nd, 3rd,4th Paragraphs and the first 3 sentences of 5th paragraph on p. 262,the 4th paragraph on p. 264 and the 5th sentence of 3rd paragraph on p. 265 may be relevant).

Yagasaki Takuya, Nakanishi Rou, "Resistance Film Type Touch Panel", Technologies and Developments of Touch Panels, Amc, First Impression, pp. 80-93, Dec. 27, 2004(the 2nd Paragraph on p. 81 and the 2nd Paragraph on p. 91 may be relevant).

Ri Kurosawa, "Technology Trends of Capacitive Touch Panel", Technology and Development of Touch Panel, Amc, First Impression, pp. 54-64, Dec. 27, 2004(the 6th paragraph on p. 55 may be relevant).

Mei Zhang etal., "Strong Transparent, Multifunctional, Carbon Nanotube Sheets", Science, America, AAAS, vol. 309, pp. 1215-1219, Aug. 19, 2005.

George Gruner, "Carbon Nanonets Spark New Electronics", Scientific American, pp. 76-83, May 2007.

Yu Xiang, Technique of Touch Panel & the Production of Resistance-type Touch Panel Insulation Dot, Journal of Longyan Teachers College, p. 25-26, vol. 22, No. 6, 2004.

Fan et al. "Self-Oriented Regular Arrays of Carbon Nanotubes and Their Field Emission Properties". Science, vol. 283, (1999);pp. 512-514.

Wu et al."Transparent, Conductive Carbon Nanotube Films". Science,vol. 305,(2004);pp. 1273-1276.

ASM Handbook."vol. 2 Properties and Selection: Nonferrous Alloys and Special-Purpose Materials".Apr. 2007; pp. 840-853.

Susuki et al."Investigation of physical and electric properties of silver pastes as binder for thermoelectric materials". Review of Scientific Instruments,76,(2005);pp. 023907-1 to 023907-5.

\* cited by examiner preparing an upper component comprising a touch panel, a first polarizer, and a first alignment layer

↓ preparing a bottom component comprising a second alignment layer, a thin film transistor panel, and a second polarizer

↓ placing a liquid crystal layer between the first alignment layer of the upper component and the second alignment layer of the bottom component

FIG. 19

METHOD FOR MAKING LIQUID CRYSTAL DISPLAY SCREEN

RELATED APPLICATIONS

This application is continuation of application entitled, "LIQUID CRYSTAL DISPLAY SCREEN", U.S. application Ser. No. 12/459,566, filed Jul. 2, 2009. This application is related to applications entitled, "LIQUID CRYSTAL DISPLAY SCREEN", U.S. application Ser. No. 12/583,161, filed Aug. 13, 2009; "LIQUID CRYSTAL DISPLAY SCREEN", U.S. application Ser. No. 12/583,154, filed Aug. 13, 2009; "LIQUID CRYSTAL DISPLAY SCREEN", U.S. application Ser. No. 12/459,545, filed Jul. 2, 2009; "TOUCH PANEL", U.S. application Ser. No. 12/583,162, filed Aug. 13, 2009; "METHOD FOR MAKING TOUCH PANEL", U.S. application Ser. No. 12/584,415, filed Sep. 3, 2009; "TOUCH PANEL AND DISPLAY DEVICE ADOPTING THE SAME", U.S. application Ser. No. 12/584,387, filed Sep. 3, 2009; "METHOD FOR MAKING LIQUID CRYSTAL DISPLAY SCREEN", U.S. application Ser. No. 12/583,160, filed Aug. 13, 2009; "METHOD FOR MAKING LIQUID CRYSTAL DISPLAY SCREEN", U.S. application Ser. No. 12/584,410, filed Sep. 3, 2009; "TOUCH PANEL", U.S. application Ser. No. 12/286,266, filed Sep. 29, 2008; "TOUCH PANEL", U.S. application Ser. No. 12/286,141, filed Sep. 29, 2008; "TOUCH PANEL AND DISPLAY DEVICE USING THE SAME", U.S. application Ser. No. 12/286,189, filed Sep. 29, 2008; "TOUCH PANEL AND DISPLAY DEVICE USING THE SAME", U.S. application Ser. No. 12/286,181, filed Sep. 29, 2008; "TOUCH PANEL AND DISPLAY DEVICE USING THE SAME", U.S. application Ser. No. 12/286,176, filed Sep. 29, 2008; "TOUCH PANEL AND DISPLAY DEVICE USING THE SAME", U.S. application Ser. No. 12/286,166, filed Sep. 29, 2008; "TOUCH PANEL AND DISPLAY DEVICE USING THE SAME", U.S. application Ser. No. 12/286,178, filed Sep. 29, 2008; "TOUCH PANEL AND DISPLAY DEVICE USING THE SAME", U.S. application Ser. No. 12/286,148, filed Sep. 29, 2008; "TOUCHABLE CONTROL DEVICE", U.S. application Ser. No. 12/286,140, filed Sep. 29, 2008; "TOUCH PANEL AND DISPLAY DEVICE USING THE SAME", U.S. application Ser. No. 12/286,154, filed Sep. 29, 2008; "TOUCH PANEL AND DISPLAY DEVICE USING THE SAME", U.S. application Ser. No. 12/286,216, filed Sep. 29, 2008; "TOUCH PANEL AND DISPLAY DEVICE USING THE SAME", U.S. application Ser. No. 12/286,152, filed Sep. 29, 2008; "TOUCH PANEL AND DISPLAY DEVICE USING THE SAME", U.S. application Ser. No. 12/286,146, filed Sep. 29, 2008; "TOUCH PANEL AND DISPLAY DEVICE USING THE SAME", U.S. application Ser. No. 12/286,145, filed Sep. 29, 2008; "TOUCH PANEL, METHOD FOR MAKING THE SAME, AND DISPLAY DEVICE ADOPTING THE SAME", U.S. application Ser. No. 12/286,155, filed Sep. 29, 2008; "TOUCH PANEL AND DISPLAY DEVICE USING THE SAME", U.S. application Ser. No. 12/286,179, filed Sep. 29, 2008; "TOUCH PANEL, METHOD FOR MAKING THE SAME, AND DISPLAY DEVICE ADOPTING THE SAME", U.S. application Ser. No. 12/286,228, filed Sep. 29, 2008; "TOUCH PANEL AND DISPLAY DEVICE USING THE SAME", U.S. application Ser. No. 12/286,153, filed Sep. 29, 2008; "TOUCH PANEL AND DISPLAY DEVICE USING THE SAME", U.S. application Ser. No. 12/286,184, filed Sep. 29, 2008; "METHOD FOR MAKING TOUCH PANEL", U.S. application Ser. No. 12/286,175, filed Sep. 29, 2008; "METHOD FOR MAKING TOUCH PANEL", U.S. application Ser. No. 12/286,195, filed Sep. 29, 2008; "TOUCH PANEL AND DISPLAY DEVICE USING THE SAME", U.S. application Ser. No. 12/286,160, filed Sep. 29, 2008; "TOUCH PANEL AND DISPLAY DEVICE USING THE SAME", U.S. application Ser. No. 12/286,220, filed Sep. 29, 2008; "TOUCH PANEL AND DISPLAY DEVICE USING THE SAME", U.S. application Ser. No. 12/286,227, filed Sep. 29, 2008; "TOUCH PANEL AND DISPLAY DEVICE USING THE SAME", U.S. application Ser. No. 12/286,144, filed Sep. 29, 2008; "TOUCH PANEL AND DISPLAY DEVICE USING THE SAME", U.S. application Ser. No. 12/286,218, filed Sep. 29, 2008; "TOUCH PANEL AND DISPLAY DEVICE USING THE SAME", U.S. application Ser. No. 12/286,1428, filed Sep. 29, 2008; "TOUCH PANEL AND DISPLAY DEVICE USING THE SAME", U.S. application Ser. No. 12/286,241, filed Sep. 29, 2008; "TOUCH PANEL, METHOD FOR MAKING THE SAME, AND DISPLAY DEVICE ADOPTING THE SAME", U.S. application Ser. No. 12/286,151, filed Sep. 29, 2008; "ELECTRONIC ELEMENT HAVING CARBON NANOTUBES", U.S. application Ser. No. 12/286,143, filed Sep. 29, 2008; and "TOUCH PANEL, METHOD FOR MAKING THE SAME, AND DISPLAY DEVICE ADOPTING THE SAME", U.S. application Ser. No. 12/286,219, filed Sep. 29, 2008; and "PERSONAL DIGITAL ASSISTANT", U.S. application Ser. No. 12/384,329, filed Apr. 2, 2009.

BACKGROUND

1. Technical Field

The present disclosure relates to touch panels and liquid crystal display screens and, particularly, to a carbon nanotube based touch panel, a liquid crystal display screen using the same, and methods for making the touch panel and the liquid crystal display screen.

2. Description of Related Art

Liquid crystal displays (LCDs) are typically used as the display in various devices such as computers, and vehicle and airplane instrumentation. Following the advancement in recent years of various electronic apparatuses toward high performance and diversification, there has been continuous growth in the number of electronic apparatuses equipped with optically transparent touch panels at the front of their respective display devices (e.g., liquid crystal panels). Users may operate a touch panel by pressing or touching the touch panel with a finger, a pen, a stylus, or a like tool while visually observing the liquid crystal display through the touch panel. Therefore, a demand exists for touch panels that are superior in visibility and reliable in operation.

At present, different types of touch panels, including resistance, capacitance, infrared, and surface sound-wave types have been developed. Resistance-type touch panels have been widely used due to their high accuracy and low cost of production.

A conventional resistance-type touch panel includes an upper substrate, a transparent upper conductive layer formed on a lower surface of the upper substrate, a lower substrate, a transparent lower conductive layer formed on an upper surface of the lower substrate, and sometimes, a plurality of dot spacers formed between the transparent upper conductive layer and the transparent lower conductive layer. The transparent upper conductive layer and the transparent lower conductive layer are formed of electrically conductive indium tin oxide (ITO).

In operation, an upper surface of the upper substrate is pressed with a finger, a pen, or a like tool, and visual observation of a screen on the liquid crystal display device provided on a back side of the touch panel is provided. This causes the upper substrate to be deformed, and the upper conductive layer thus comes in contact with the lower conductive layer at the position where the pressing occurs. An electronic circuit separately applies voltages to the transparent upper conductive layer and the transparent lower conductive layer. Thus, the electronic circuit can detect the deformed position.

Each of the transparent conductive layers (e.g., ITO layers) is generally formed by means of ion-beam sputtering, and this method is relatively complicated. Additionally, the ITO layer has poor wearability/durability, low chemical endurance, and uneven resistance over an entire area of the touch panel. All the above-mentioned problems of the ITO layer make for a touch panel and a liquid crystal display screen with low sensitivity and short lifetime.

What is needed, therefore, is to provide a touch panel, a liquid crystal display screen using the same, and methods for making the touch panel and the liquid crystal display in which the above problems are eliminated or at least alleviated.

BRIEF DESCRIPTION OF THE DRAWINGS

Many aspects of the present touch panel, the liquid crystal display screen using the same, and the methods for making the touch panel and the liquid crystal display screen can be better understood with reference to the following drawings. The components in the drawings are not necessarily drawn to scale; the emphasis instead being placed upon clearly illustrating the principles of the present touch panel, the liquid crystal display screen using the same, and the methods for making the touch panel and the liquid crystal display screen.

FIG. 19 is a flow chart of a method for making the liquid crystal display screen.

Figure 1:
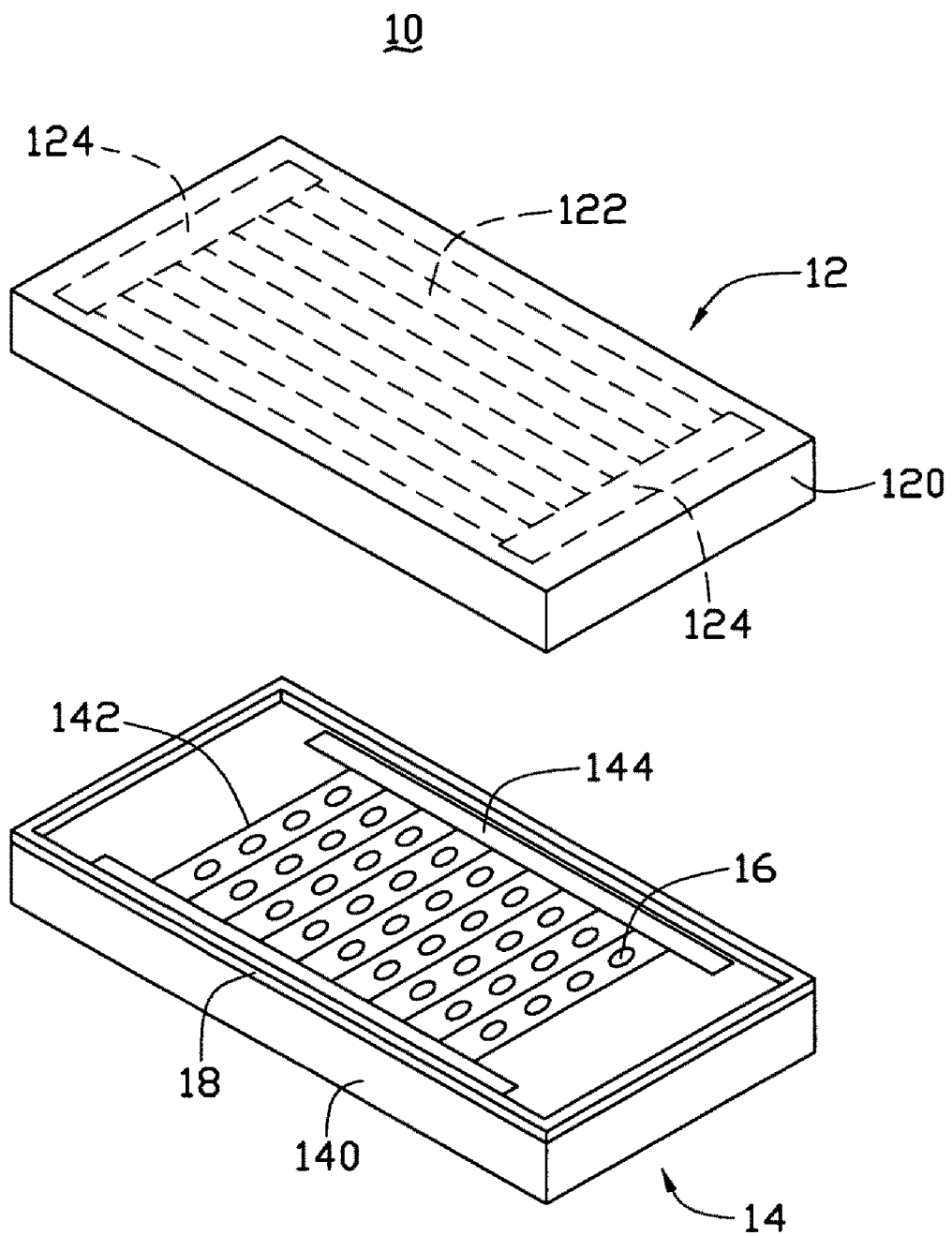
FIG. 1 is a schematic view of a partially assembled touch panel in accordance with an embodiment.

Corresponding reference characters indicate corresponding parts throughout the several views. The exemplifications set out herein illustrate at least one exemplary embodiment of the present touch panel, the liquid crystal display screen using the same, and the methods for making the touch panel and the liquid crystal display screen incorporating the same, in at least one form, and such exemplifications are not to be construed as limiting the scope of the disclosure in any manner.

DETAILED DESCRIPTION OF EXEMPLARY EMBODIMENTS

Reference will now be made to the drawings to describe, in detail, embodiments of the present touch panel, the liquid crystal display screen using the same, and the methods for making the touch panel and the liquid crystal display screen.

Touch Panel

Figure 2:
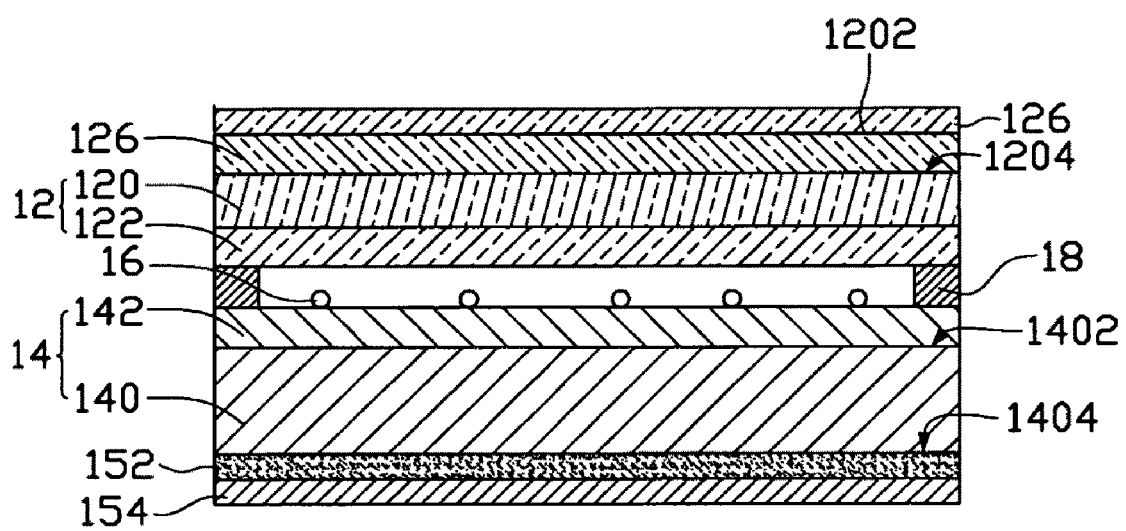
FIG. 2 is a cross-sectional view of the touch panel of FIG. 1.

Referring to FIG. 1 and FIG. 2, a touch panel 10 includes a first electrode plate 12, a second electrode plate 14, and a plurality of dot spacers 16 located between the first electrode plate 12 and the second electrode plate 14.

The first electrode plate 12 includes a first substrate 120, a first conductive layer 122, and two first-electrodes 124. The two first-electrodes 124 and the first conductive layer 122 are located on the second surface 1204 of the first substrate 120. The two first-electrodes 124 can be located on the first conductive layer 122, or the two first-electrodes 124 can be located on the first substrate 120 and electrically connected to the first conductive layer 122. A direction from one of the first-electrodes 124 across the first conductive layer 122 to the other first electrode 124 is defined as a first direction.

The second electrode plate 14 includes a second substrate 140, a second conductive layer 142, and two second-electrodes 144. The second substrate 140 includes substantially flat first surface 1402 and second surface 1404. The two second-electrodes 144 and the second conductive layer 142 are located on the first surface 1402 of the second substrate 140. The two second-electrodes 144 can be located on second conductive layer 142, or the two second-electrodes 144 can be located on the second substrate 140 and electrically connected to the second conductive layer 142. A direction from one of the second-electrodes 144 across the second conductive layer 142 to the other second-electrode 144 is defined as a second direction and is perpendicular to the first direction.

The first substrate 120 and the second substrate 140 can be transparent plates, sheets or films. The first substrate 120 can be made of flexible materials, such as plastic and resin. The second substrate 140 can be made of rigid materials, such as glass, quartz and diamond, or can be made of flexible material. The second substrate 140 can be configured for supporting the second conductive layer 142. When the first substrate 120 and the second substrate 140 are made of flexible materials and have flexible planer structures, a thickness of the first substrate 120 or the second substrate 140 can range from about 0.01 millimeters to about 1 centimeter. Materials of the first substrate 120 and the second substrate 140 can be selected from a group consisting of polycarbonate (PC), polymethyl methacrylate (PMMA), polyethylene terephthalate (PET), PES, cellulose acetate, benzocyclobutene, polyvinyl chloride (PVC), any other acrylic resins, and any combination thereof. In one embodiment, both the first substrate 120 and the second substrate 140 are PET films and the thickness of the first substrate 120 or the second substrate 140 is about 2 millimeters. It can be understood that the materials of the first substrate 120 and the second substrate 140 are not limited, and can be any materials that have suitable degree of transparency and makes the first substrate 120 flexible and the second substrate 140 strong enough to support the second conductive layer 142.

The first-electrodes 124 and the second-electrodes 144 comprise of conductive materials, such as metals, conductive polymer materials, or carbon nanotubes. The metals can be gold, silver, copper or any other metal having a good conductivity. The conductive polymer materials can be polyacetylene, polyparaphenylene, polyaniline, or polythiophene. In one embodiment, the first-electrodes 124 and second-electrodes 144 are made of conductive silver pastes.

An insulator 18 is provided between the first and the second electrode plates 12 and 14. The first electrode plate 12 can be located on the insulator 18. The first conductive layer 122 is opposite to, but is spaced from, the second conductive layer 142. The dot spacers 16, if employed, are separately located between the conductive layers 122, 142. A distance between the second electrode plate 14 and the first electrode plate 12 can range from about 2 micrometers to 20 micrometers. The insulator 18 and the dot spacers 16 can be made of insulative resins or any other suitable insulative material. Therefore, insulation between the first electrode plate 12 and the second electrode plate 14 is provided by the insulator 18 and the dot spacers 16. It is to be understood that the dot spacers 16 are optional, particularly when the touch panel 10 is relatively small. Their need is governed by the size of the span and the strength of the first electrode plate 12.

In some embodiments, at least one of the first conductive layer 122 and the second conductive layer 142 comprises a Touch Panel (TP) carbon nanotube layer or a TP carbon nanotube composite layer. The TP carbon nanotube layer can be composed of one or more carbon nanotube films. In one embodiment, the TP carbon nanotube layer can be a substantially pure structure of the carbon nanotubes, with few impurities. The thickness of the TP carbon nanotube layer or a TP carbon nanotube composite layer can be in a range from about 0.5 nanometers to about 1 millimeter. The thickness of the carbon nanotube film can be in a range from about 0.5 nanometers to about 100 micrometers. Both the TP carbon nanotube layer and TP carbon nanotube composite layer can be transparent carbon nanotube structures.

It is to be understood that the size of the touch panel 10 is not confined by the size of the carbon nanotube films. When the size of the carbon nanotube films is smaller than the desired size of the touch panel 10, a plurality of carbon nanotube films in each conductive layer can be coplanar, located side by side and/or overlapping to cover the entire surface of the first and second substrates 120, 140. Thus, the size of the touch panel 10 can be set as desired. In each conductive layer, a plurality of carbon nanotube films can be stacked with each other, and thus, a thickness of the carbon nanotube layer can be set in a range where each conductive layer has an acceptable transparency. Alignment directions of the carbon nanotube films can be as desired.

TP Carbon Nanotube Layer

Figure 3:
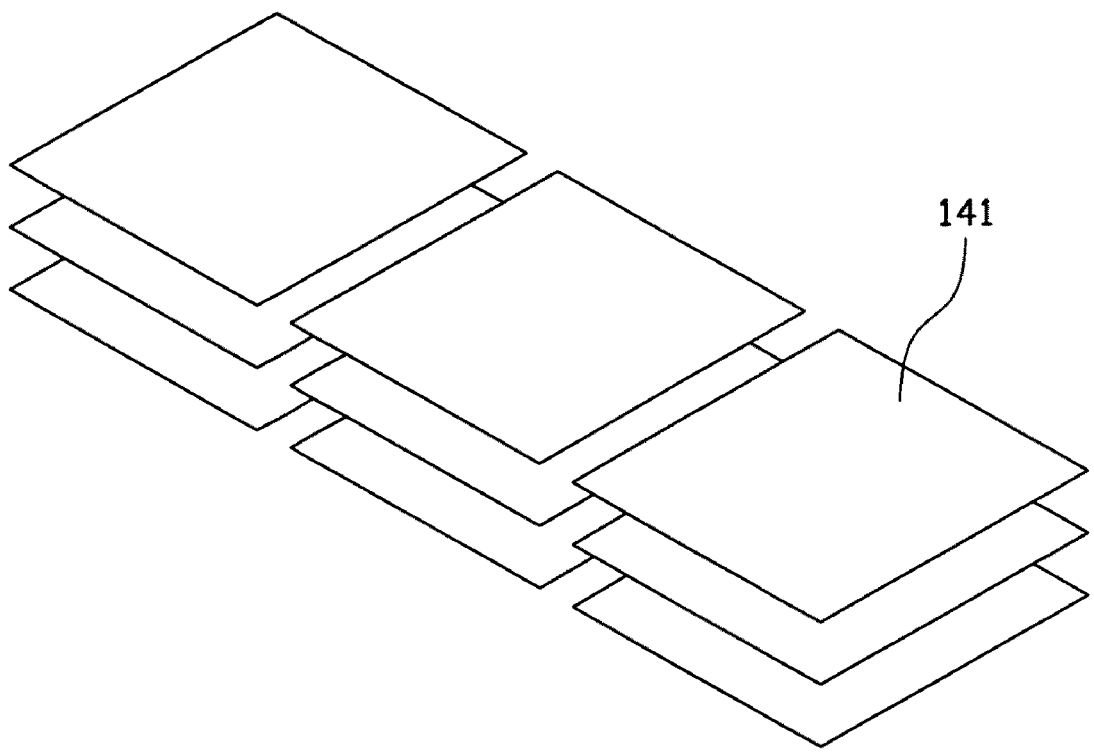
FIG. 3 is a schematic view of a carbon nanotube layer used in the touch panel of FIG. 1.

The TP carbon nanotube layer 149 has a planar structure and the carbon nanotubes therein are uniformly distributed. A thickness of the TP carbon nanotube layer 149 can range from about 0.5 nanometers to 100 micrometers. Referring to FIG. 3, the TP carbon nanotube layer 149 can include one or more carbon nanotube films 141 having a plurality of carbon nanotubes therein. The carbon nanotubes in the carbon nanotube film 141 are orderly or disorderly distributed to form an ordered carbon nanotube film 141 or a disordered carbon nanotube film 141. The term 'disordered carbon nanotube film' includes, but not limited too, a film where the carbon nanotubes are arranged along many different directions, arranged such that the number of carbon nanotubes arranged along each different direction can be almost the same (e.g. uniformly disordered); and/or entangled with each other. 'Ordered carbon nanotube film' includes, but not limited to, a film where the carbon nanotubes are arranged in a consistently systematic manner, e.g., the carbon nanotubes are arranged approximately along a same direction and or have two or more sections within each of which the carbon nanotubes are arranged approximately along a same direction (different sections can have different directions).

In the disordered film, the carbon nanotubes are disordered. The disordered film can be isotropic. The disordered carbon nanotubes can be attracted to each other by van der Waals attractive therebetween. The individual carbon nanotubes can be substantially parallel to a surface of the carbon nanotube film 141. Two or more stacked carbon nanotube films 141 may be used in each conductive layer. Carbon nanotubes in adjacent ordered carbon nanotube films 141 can be arranged along a same direction or different directions.

Figure 4:
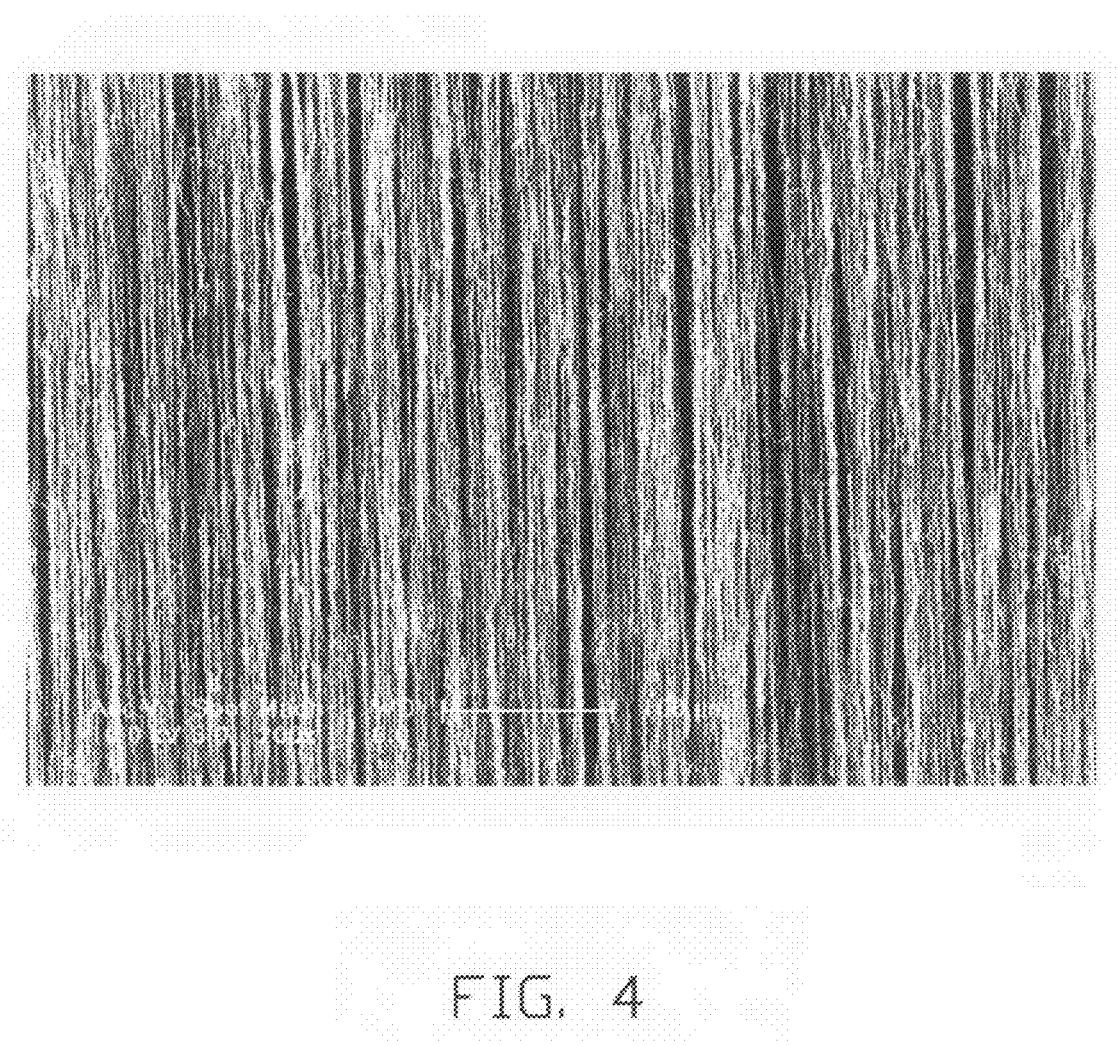
FIG. 4 shows an SEM image of a carbon nanotube film.
Figure 5:
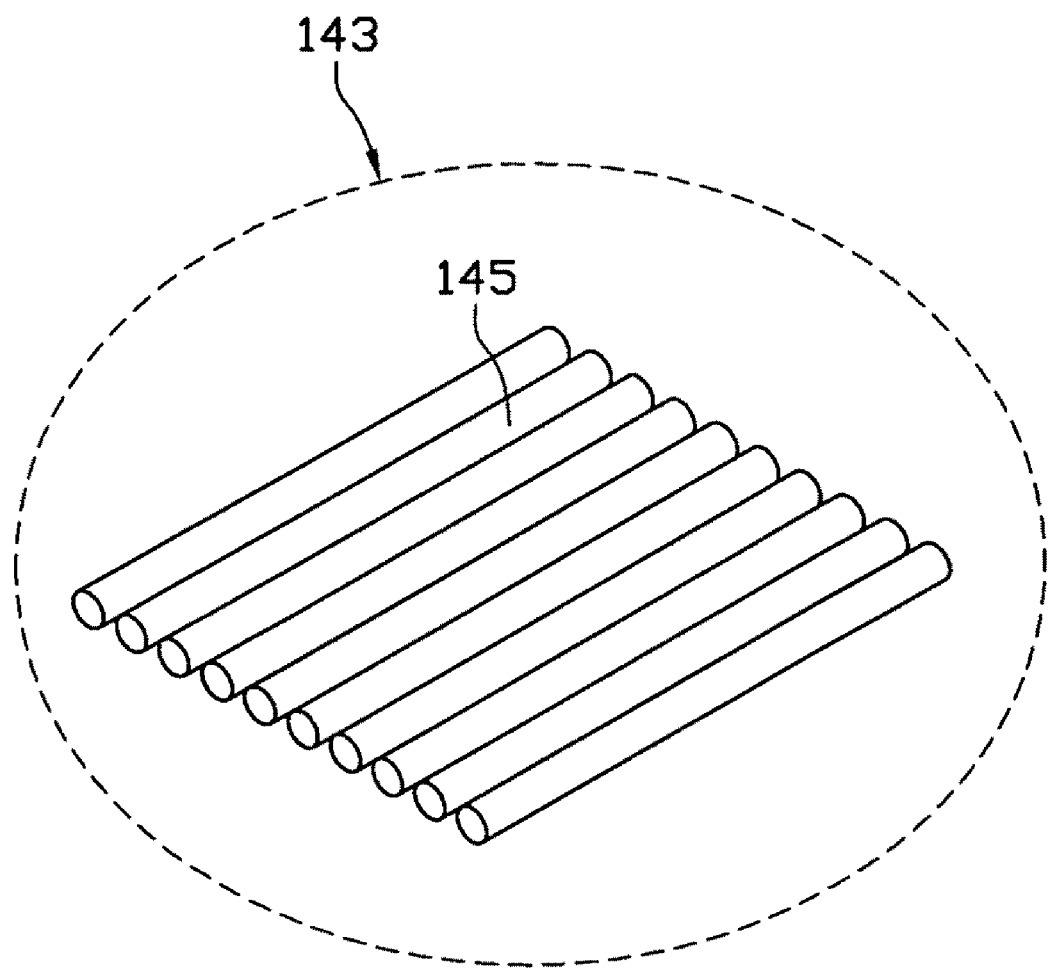
FIG. 5 is a structural schematic of a carbon nanotube segment.

The ordered film can be a carbon nanotube film 141 directly drawn from a carbon nanotube array. Referring to FIGS. 4 and 5, the drawn carbon nanotube film 141 can include a plurality of successively oriented carbon nanotube segments 143 joined end-to-end by van der Waals attractive force therebetween. Each carbon nanotube segment 143 includes a plurality of carbon nanotubes 145 parallel to each other, and combined by van der Waals attractive force therebetween. The carbon nanotube segments 143 can vary in width, thickness, uniformity and shape. The carbon nanotubes 145 in the carbon nanotube film 141 are also oriented along a preferred orientation. When the carbon nanotube layer 149 includes two or more stacked drawn carbon nanotube films 141, the angle between the aligned directions of the carbon nanotubes in the adjacent two drawn carbon nanotube films 141 ranges from above or equal to 0 degrees to about 90 degrees. The carbon nanotubes in the carbon nanotube film can be selected from a group consisting of single-walled, double-walled, and/or multi-walled carbon nanotubes. The diameter of the single-walled carbon nanotubes ranges from about 0.5 nm to about 50 nm, the diameter of the double-walled carbon nanotubes ranges from about 1.0 nm to about 50 nm, and the diameter of the multi-walled carbon nanotubes ranges from about 1.5 nm to about 50 nm.

In one embodiment, the first conductive layer 122 and the second conductive layer 142 both include the drawn carbon nanotube films 141. The carbon nanotubes 145 in the first conductive layer 122 are arranged along the first direction, and the carbon nanotubes 145 in the second conductive layer 142 are arranged along the second direction. The first direction is perpendicular to the second direction. Thus, the conductivities between the two first-electrodes 124 and between the two second-electrodes 144 can be improved by the alignment of the carbon nanotubes 145. As shown in FIG. 4, the majority of the carbon nanotubes 145 are arranged along a primary direction; however, the orientation of some of the carbon nanotubes 145 may vary.

TP Carbon Nanotube Composite Layer

Figure 6:
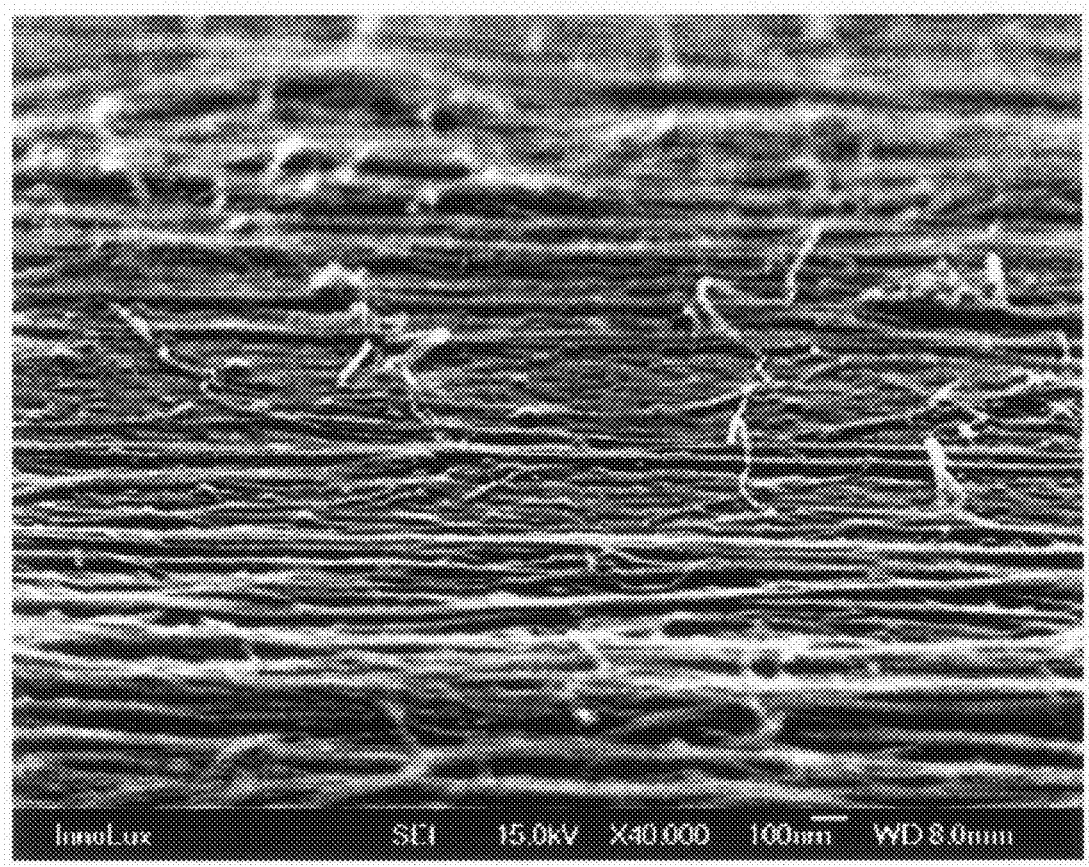
FIG. 6 shows a Scanning Electron Microscope (SEM) image of a carbon nanotube composite layer.

Referring to FIG. 6, the TP carbon nanotube composite layer comprises a carbon nanotube film 141 and polymer materials infiltrating the carbon nanotube film 141. It is to be understood that spaces are existed in the adjacent carbon nanotubes in the carbon nanotube film 141, and thus the carbon nanotube film 141 includes a plurality of micropores defined by the adjacent carbon nanotubes therein. The polymer material is filled into the micropores in the carbon nanotube film 141 to form the TP carbon nanotube composite layer. The polymer materials can be distributed uniformly in the TP carbon nanotube layer 149. The TP carbon nanotube composite layer includes one or more carbon nanotube films 141. The TP carbon nanotube composite layer can have a uniform thickness. A thickness of the carbon nanotube composite layer is only limited by the degree of transparency desired. In one embodiment, the thickness of the carbon nanotube composite layer can range from about 0.5 nanometers to about 1 millimeter. The polymer material can be transparent, and not limited to a specific material. The polymer material can be selected from a group consisting of polystyrene, polyethylene, polycarbonate, polymethyl methacrylate (PMMA), polycarbonate (PC), polyethylene terephthalate (PET), Benzo Cyclo Butene (BCB), and polyalkenamer. In one embodiment, the polymer material is PMMA. The polymer material can improve the connection between the TP carbon nanotube composite layer and the substrate.

Figure 7:
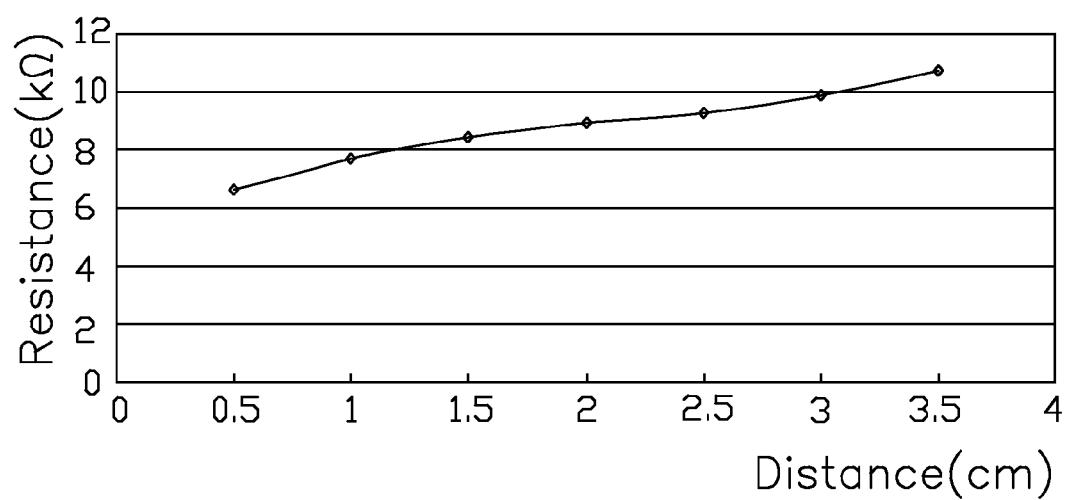
FIG. 7 shows a linear relationship of the resistance of the carbon nanotube composite layer according to one embodiment.

Furthermore, referring to FIG. 7, due to the polymer material infiltrated into the TP carbon nanotube composite layer, unwanted short circuits in the TP carbon nanotube composite layer can be eliminated, and thus the resistance of the TP carbon nanotube composite layer has a nearly linear relationship with length. Accordingly, the accuracy of the touch panel 10 can be improved.

It is to be understood that, the TP carbon nanotube composite layer also can comprise a plurality of separately preformed carbon nanotube composite films located side by side or stacked with each other.

In one embodiment, both the first conductive layer 122 and the second conductive layer 142 include a carbon nanotube composite layer formed by a drawn carbon nanotube film 141 and PMMA distributed uniformly therein. Specifically, the PMMA is distributed in the spaces between adjacent carbon nanotubes in the carbon nanotube film 141. The carbon nanotubes in the first conductive layer 122 are arranged along the first direction, and the carbon nanotubes in the second conductive layer 142 are arranged along the second direction. It is to be understood that some variation can occur in the orientation of the carbon nanotubes in the carbon nanotube film 141 as can be seen in FIGS. 4 and 6.

A transparent protective film 126 can be further located on the top surface of the touch panel 10 (e.g., on the first surface 1202 of the first substrate 120). The transparent protective film 126 can be a film that receives a surface hardening treatment to protect the first electrode plate 12 from being scratched when the touch panel 10 is in use. The transparent protective film 126 can be plastic or resin.

The touch panel 10 can further include a shielding layer 152 located on the lower surface of the second substrate 140 (e.g., on the second surface 1404 of the second substrate 140). The material of the shielding layer 152 can be selected from a group consisting of indium tin oxide, antimony tin oxide, carbon nanotube film 141, and other conductive materials. In one embodiment, the shielding layer 146 is a carbon nanotube film 141. The shielding layer 152 is connected to ground and plays a role of shielding and, thus, enables the touch panel 10 to operate without interference (e.g., electromagnetic interference). Furthermore, a passivation layer 154 can be located on a surface of the shielding layer 152, on the side away from the second substrate 140. The material of the passivation layer 154 can, for example, be silicon nitride or silicon dioxide. The passivation layer 154 can protect the shielding layer 152 from chemical or mechanical damage.

The touch panel 10 can be located on a display device. The display device can be a monochrome display, color graphics adapter (CGA) display, enhanced graphics adapter (EGA) display, variable-graphics-array (VGA) display, super VGA display, liquid crystal display (LCD), cathode ray tube (CRT), plasma displays and the like. The display device with the touch panel 10 thereon is operatively coupled to a processor and may be a separated component (peripheral device) or be integrated with the processor and program storage to form a desktop computer (all in one machine), a laptop, handheld or tablet or the like.

Method for Making Touch Panel

Figure 8:
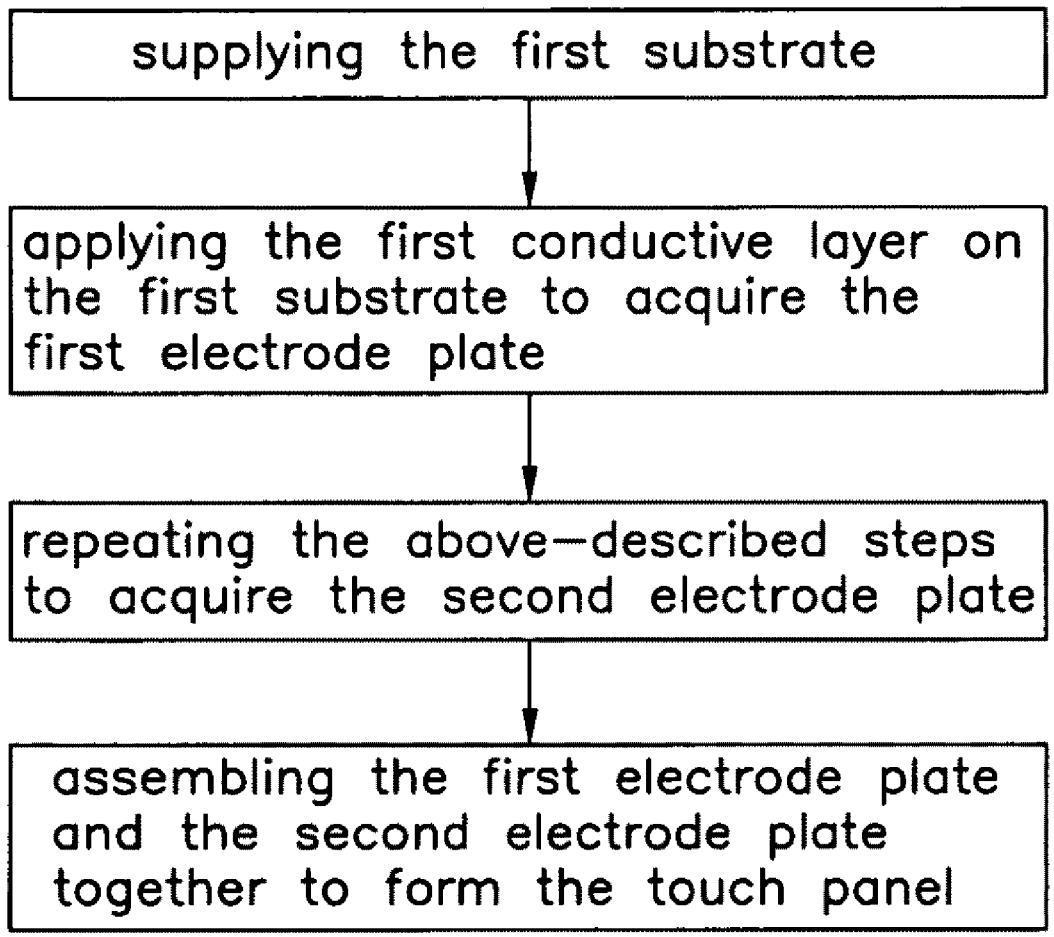
FIG. 8 is a flow chart of a method for making a touch panel.
Figure 9:
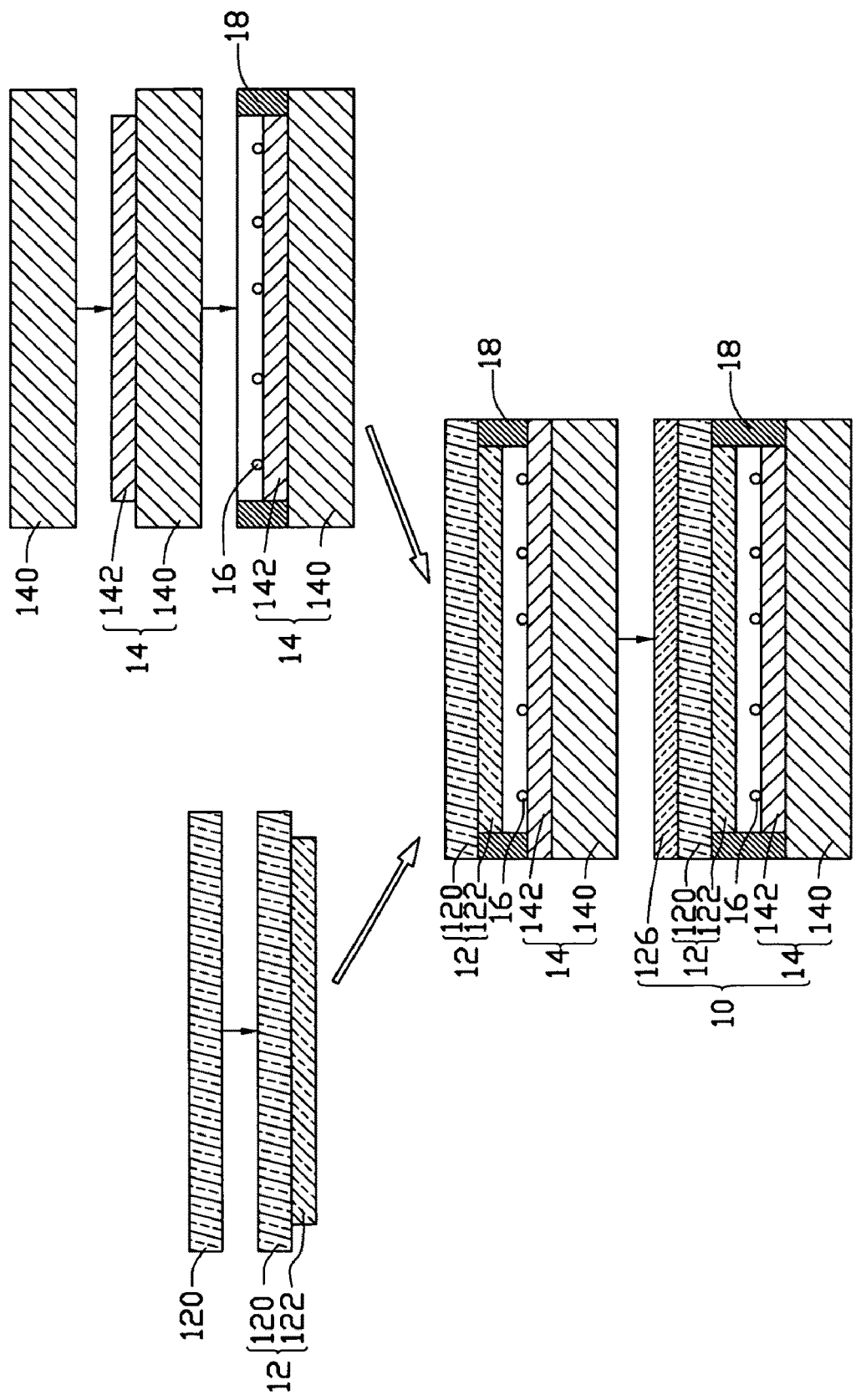
FIG. 9 shows a schematic view of a method for making the touch panel.

Referring to FIGS. 8 and 9, a method for making the touch panel 10 according to one embodiment includes the following steps of: (S10) supplying the first substrate 120; (S20) applying the first conductive layer 122 on the first substrate 120 to acquire the first electrode plate 12; (S30) repeating the above-described steps to acquire the second electrode plate 14 comprising the second conductive layer 142; and (S40) assembling the first electrode plate 12 and the second electrode plate 14 together to form the touch panel 10, wherein the first substrate 120 is spaced from the second substrate 140 and the first conductive layer 122 faces to the second conductive layer 142.

In step (S10), the first substrate 120 can have a flexible planer structure and be made of flexible material. A thickness of the first substrate 120 can range from about 0.01 millimeters to about 1 centimeter. Material of the first substrate 120 can be selected from a group consisting of polycarbonate (PC), polymethyl methacrylate (PMMA), polyethylene terephthalate (PET), PES, cellulose acetate, benzocyclobutene, polyvinyl chloride (PVC), and any other acrylic resins, and any combination thereof. In one embodiment, the first substrate 120 is a PET film, the thickness of the first substrate 120 is about 2 millimeters, the width of the first substrate 120 is about 20 centimeters, and the length of the first substrate 120 is about 30 centimeters. It can be understood that the material of the substrates is only limited by the desired degree of transparency and flexibility sought for the substrates.

When the first conductive layer 122 includes the TP carbon nanotube layer 149, step (S20) can include the following steps of: (S201) providing at least one carbon nanotube film 141; (S202) treating the at least one carbon nanotube film 141 by a laser to improve the transparency of the at least one carbon nanotube film 141; and (S203) laying the at least one carbon nanotube film 141 on the second surface 1204 of the first substrate 120, thereby forming the first conductive layer 122.

In step (S201), the carbon nanotube film 141 can be an ordered carbon nanotube film 141 or a disordered carbon nanotube film 141. The carbon nanotube film 141 can be formed in many ways including a directly growing method, a pressing method, a flocculating method, or a drawing method. The method for directly growing a carbon nanotube film 141 can be executed by growing a plurality of carbon nanotubes on a substrate by a chemical vapor deposition method to form a carbon nanotube film 141, and the carbon nanotubes therein are disorderly arranged. The carbon nanotube film 141 is a disordered film.

Forming a carbon nanotube film 141 by the flocculating method can be executed by providing carbon nanotubes; flocculating the carbon nanotubes in a solvent to acquire a carbon nanotube flocculate structure; separating the carbon nanotube flocculate structure from the solvent; and shaping the separated carbon nanotube floccule structure into the carbon nanotube film 141 in which the carbon nanotubes are entangled with each other and isotropic.

Forming a carbon nanotube film 141 by the pressing method can be executed by providing an array of carbon nanotubes formed on a substrate; and providing a pressing device to press the array of carbon nanotubes, thereby forming a carbon nanotube film 141 in which the carbon nanotubes are arranged along one direction, or two or more directions.

In one embodiment, the carbon nanotube film 141 is a drawn carbon nanotube film 141 formed by the drawing method. The drawing method is executed by drawing the drawn carbon nanotube film 141 from a carbon nanotube array, and includes the following steps of: providing an array of carbon nanotubes; and pulling out a drawn carbon nanotube film 141 from the array of carbon nanotubes. Pulling can be aided by the use of a tool such as adhesive tape, pliers, tweezers, or other tools allowing multiple carbon nanotubes to be gripped and pulled simultaneously.

The drawn carbon nanotube film 141 can be formed by the substeps of: selecting one or more carbon nanotubes having a predetermined width from the array of carbon nanotubes; and pulling the carbon nanotubes at a uniform speed to form carbon nanotube segments that are joined end to end to achieve a uniform drawn carbon nanotube film 141.

The carbon nanotube segments can be selected by using a tool, such as adhesive tapes, pliers, tweezers, or other tools allowing multiple carbon nanotubes to be gripped and pulled simultaneously to contact with the array of carbon nanotubes. Referring to FIG. 4 and FIG. 5, each carbon nanotube segment 143 includes a plurality of carbon nanotubes 145 parallel to each other, and combined by van der Waals attractive force therebetween. The pulling direction can be substantially perpendicular to the growing direction of the array of carbon nanotubes.

Because of the van der Waals attractive force, the carbon nanotubes in the drawn carbon nanotube film 141 are easy to bundle together to form carbon nanotube strings with a large diameter. The carbon nanotube strings have relatively low light transmittance and thus affect the light transmittance of the drawn carbon nanotube film 141. The laser with a power density greater than $0.1 \times 10^4$ W/m$^2$ can be used to irradiate the drawn carbon nanotube film 141 to improve the light transmittance of the drawn carbon nanotube film 141 by removing the carbon nanotube strings having a low light transmittance. Step (S202) can be executed in an oxygen comprising atmosphere. In one embodiment, step (S202) is executed in an ambient atmosphere. It is also understood that the laser treatment can be used on any carbon nanotube film.

Step (S202) can be executed by many methods. In one method, the drawn carbon nanotube film 141 is fixed and a laser device moving at an even/uniform speed is used to irradiate the fixed drawn carbon nanotube film 141. In another method, the laser device is fixed, and the drawn carbon nanotube film 141 is moved through the light of the laser.

Figure 10:
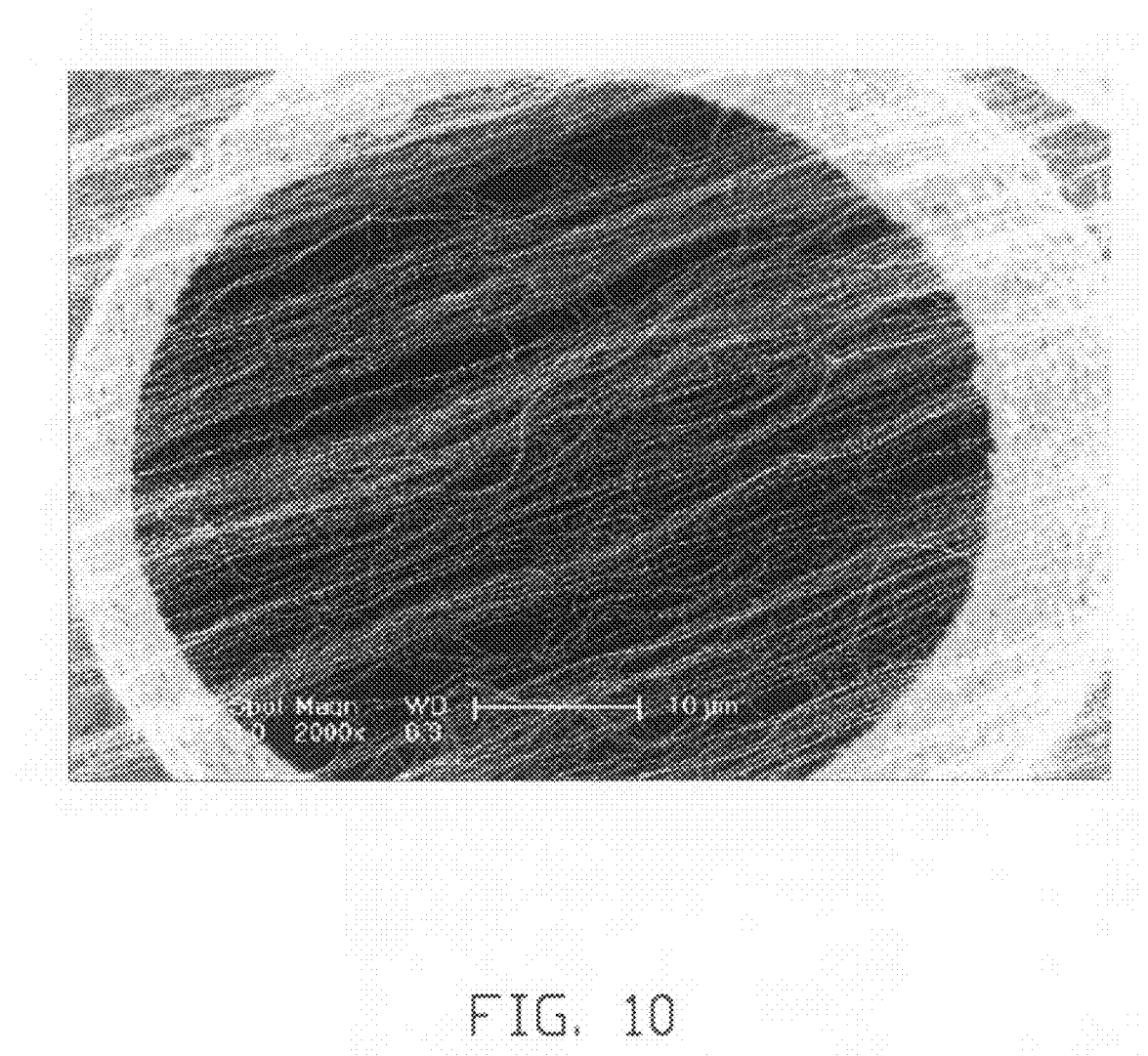
FIG. 10 shows an SEM image of a carbon nanotube film before irradiation by laser.
Figure 11:
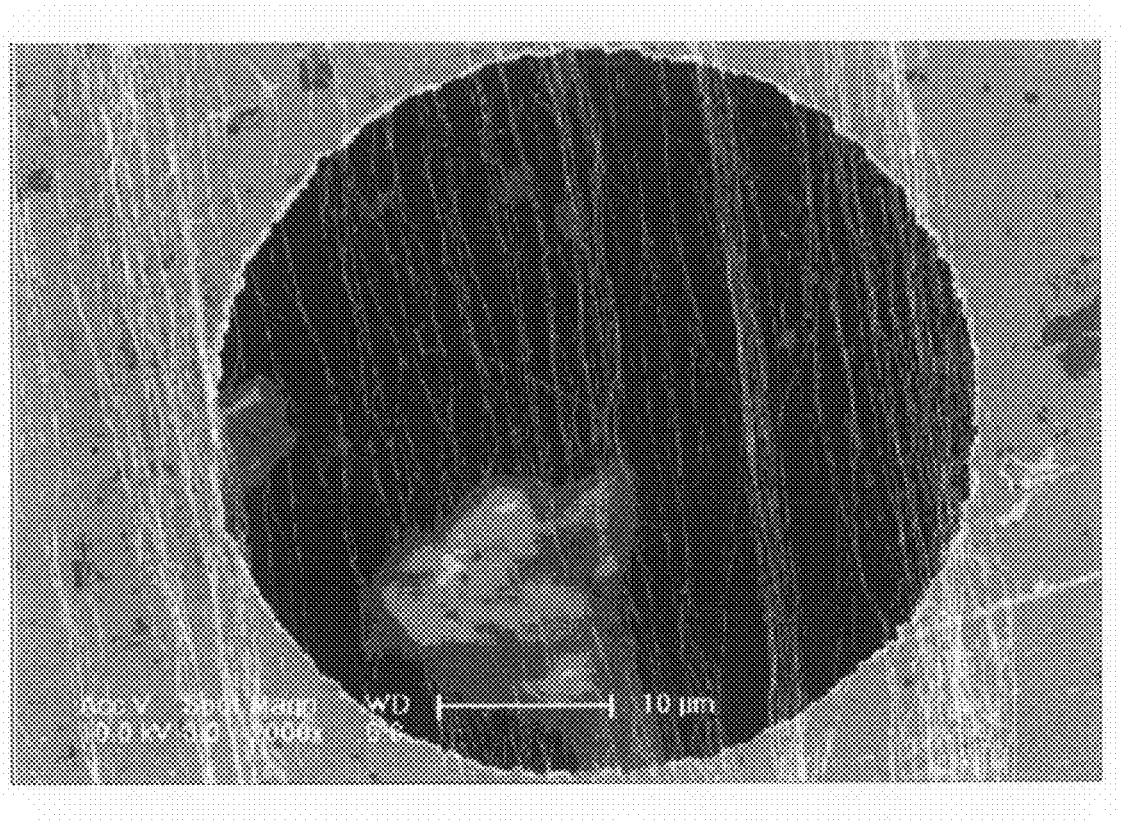
FIG. 11 shows an SEM image of a carbon nanotube film after irradiation by laser.

The carbon nanotubes absorb energy from the laser irradiation and a temperature of the drawn carbon nanotube film 141 is increased. The laser irradiation can target the carbon nanotube strings with larger diameters, because they will absorb more energy and be destroyed, leaving strings with smaller diameters and higher light transmittance, resulting in a drawn carbon nanotube film 141 having a relatively higher light transmittance. Referring to FIG. 11, we can see that the drawn carbon nanotube film 141 irradiated by the laser has a relatively higher light transmittance (can be more than 70% higher) than that in FIG. 10 that has not been irradiated with the laser.

It can be understood that any or all of the carbon nanotube films, including those located on the first and second substrates, can be treated with an organic solvent. Specifically, the drawn carbon nanotube film 141 can be treated by applying organic solvent on the drawn carbon nanotube film 141, such as dipping the organic solvent on the surface of the carbon nanotube film 141. Alternatively, the first and second substrates with the drawn carbon nanotube film 141 thereon can be put into a container, which is filled with the needed organic solvent. The organic solvent is volatilizable and can be selected from, among others, a group consisting of ethanol, methanol, acetone, dichloroethane, chloroform, and any suitable mixture thereof. In one embodiment, the organic solvent is ethanol. The supporter can be a substrate. After being soaked by the organic solvent, microscopically, carbon nanotube strings will be formed by adjacent carbon nanotubes, or portions thereof, bundling in the carbon nanotube film 141, due to the surface tension of the organic solvent as it volatizes. In one aspect, some and/or parts of the carbon nanotubes in the untreated drawn carbon nanotube film 141 that are not adhered on the substrate will adhere on the substrate after the organic solvent treatment due to the surface tension of the organic solvent. The contact area of the drawn carbon nanotube film 141 with the substrate will increase, and thus, the drawn carbon nanotube film 141 will adhere to the surface of the first substrate 340 more firmly. In another aspect, due to the decrease of the specific surface area via bundling, the mechanical strength and toughness of the drawn carbon nanotube film 141 are increased and the coefficient of friction of the drawn carbon nanotube film 141 is reduced. Macroscopically, a treated drawn carbon nanotube film 141 has approximately a uniform structure.

Optional step (S202) is used to improve the light transmittance of the drawn carbon nanotube film 141.

In step (S203), as described above, the drawn carbon nanotube film 141 can be simply laid on the second surface 1204 of the first substrate 120. The drawn carbon nanotube film 141 is adhesive in nature. As such, the drawn carbon nanotube film 141 can be directly adhered to the second surface 1204 of the first substrate 120. Further, a plurality of drawn carbon nanotube films 141 can be stacked or located side by side on the second surface 1204 of the first substrate 120 to form the above described carbon nanotube layer. The carbon nanotube films 141 can be laid on the first substrate 120 along a first direction.

In one embodiment, when the first conductive layer 122 includes the carbon nanotube composite layer, step (S20) can include the following steps of: (S211) coating a layer of polymer solution on the surface of the first substrate 120; (S212) optionally treating a carbon nanotube film 141 with laser light; (S213) placing the carbon nanotube film 141 on the layer of polymer solution; and (S214) infiltrating the polymer solution into the carbon nanotube film 141, and curing the polymer solution to form the TP carbon nanotube composite layer.

In step (S211), a tool such as a brush can be used to apply a coat of the polymer solution on the surface of the first substrate 120, or the surface of the first substrate 120 can be immersed in the polymer solution. It can be understood that the method for forming the layer of polymer solution is not limited to the above-described method. It is also understood that the polymer can be added to any carbon nanotube film.

The polymer solution can be formed by dissolving a polymer material in an organic solution. The polymer solution has a certain viscosity. In one embodiment, the viscosity of the solution can be greater than 1 Pa·s. The polymer material can be in a solid state at room temperature, and can be transparent.

The polymer material can include a material selected from a group consisting of polystyrene, polyethylene, polycarbonate, polymethyl methacrylate (PMMA), polycarbonate (PC), terephthalate (PET), benzo cyclo butene (BCB) and polyalkenamer. The organic solution can be selected from a group consisting of ethanol, methanol, acetone, dichloroethane and chloroform. In one embodiment, the polymer material is PMMA, and the organic solution is ethanol.

The optional step (S212) is similar to the step of (S202).

In step (S213), the at least one drawn carbon nanotube film 141 can be placed on the layer of the polymer solution directly. When there are two or more drawn carbon nanotube films 141, the two or more drawn carbon nanotube films 141 can be arranged coplanar and/or stacked. When the TP carbon nanotube layer 149 includes two or more stacked drawn carbon nanotube films 141, an angle between the aligned directions of the carbon nanotubes in two adjacent drawn carbon nanotube films 141 ranges from above 0° to about 90°. In one embodiment, the TP carbon nanotube layer 149 includes two drawn carbon nanotube films 141, and the aligned direction of the carbon nanotube films are offset by 90 degrees.

After the carbon nanotube film 141 is located on the layer of polymer solution, a stacked structure is formed which includes the first substrate 120, the layer of polymer solution and the carbon nanotube film 141 in that order.

In step (S214), pressure can be applied with a tool, such as an air knife, to the carbon nanotube film, using airspeeds of 10 meters to 20 meters/second to make the polymer material infiltrate into the drawn carbon nanotube film 141 to form the TP carbon nanotube layer 149. Afterwards, the first substrate 120 can be cured by heating it to a certain temperature to evaporate the solvent of the polymer solution. Thus, the polymer material is combined with the carbon nanotube film 141, and after the step of curing, a carbon nanotube composite layer can be acquired. The method for heating the first substrate 120 can be executed by placing the first substrate 120 into a furnace or by a UV curing method, e.g. heating the flexible substrate with UV radiation at a certain energy level to a certain temperature higher than the volatilization temperature of the solvent. In one embodiment, the curing temperature is 100° C.

Figure 12:
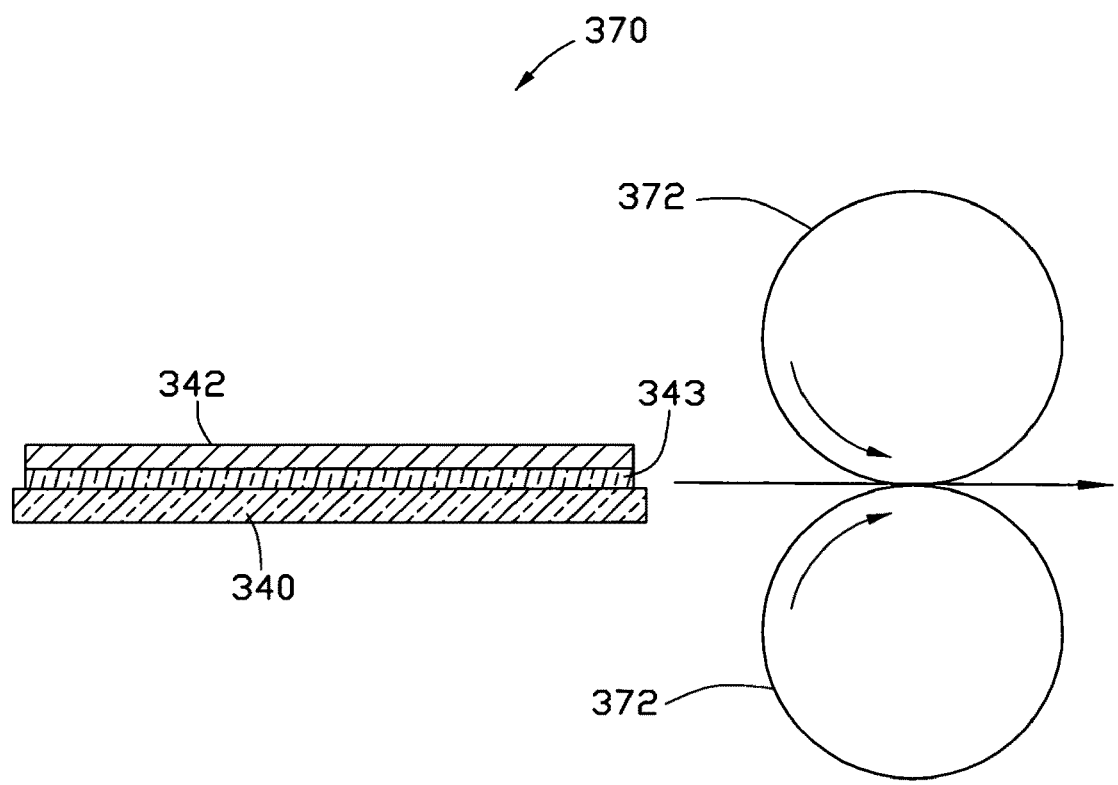
FIG. 12 shows a schematic view of a heat-pressed process used to form a heat-pressed carbon nanotube composite layer.

In one embodiment, referring to FIG. 12, a hot-pressing method can be further adopted to uniformly disperse the polymer into the carbon nanotube film 141. The hot-pressing method includes the following steps of: placing a substrate 340 with the at least one carbon nanotube film 342 and the layer of polymer solution 343 in the hot-press device 370; heating the pressing device of the hot-press device 370; and pressing of the first substrate 340 with the at least one carbon nanotube film 342 and the layer of polymer solution 343 thereon by the pressing device.

The hot-press device 370 can further include a heating device (not shown) used to heat the pressing device, the layer of polymer solution 343, and/or the carbon nanotube film. The shown hot-press device 370 is a hot-press machine with two rollers 372. A temperature of the pressing device can range from about 110° C. to about 120° C. The first substrate 340 is slowly passing through the two rollers 372. The speed of the first substrate 340 is from about 1 millimeter per minute to about 10 meters per minute. In other embodiments, a certain pressure is applied to the first substrate 340, by the heated roller 372. As such, the at least one carbon nanotube film 342, the polymer solution 343 is pressed uniformly disperse the polymer into the at least one carbon nanotube film 342. It is to be noted that when the polymer is located between the first substrate 340 and at least one carbon nanotube film 342, in the process of pressing the first substrate 340, the at least one carbon nanotube film 342 is adhered to the first substrate 340 by the polymer. After curing, the TP carbon nanotube composite layer is formed on the first substrate 340. It is understood that the temperature and speed of the hot press device can be varied according to need.

The polymer material in the TP carbon nanotube composite layer can make the TP carbon nanotube composite layer and the first substrate 120 combine more firmly. Further, the resistance of the TP carbon nanotube composite layer has a nearly linear relationship with distance due to the polymer material distributed therein. The TP carbon nanotube composite layer serves as the first conductive layer 122 in the first electrode plate 12.

It is to be understood that, the TP carbon nanotube composite layer also can be formed on a separate base, then separated with the base, and placed on the first substrate. Further, the first conductive layer 122 also can comprise a plurality of separately preformed carbon nanotube composite layers with a small size located side by side or stacked with each other.

After step (S20), a step of forming two first electrodes 124 can be further provided. The first electrodes 124 can be formed by any one or more of silver, copper and the like metals, carbon nanotube films 141, or conductive silver pastes. In one embodiment, the two first electrodes 124 are made of conductive silver paste. One method for making the two first silver paste electrodes includes the following steps of: coating conductive silver paste on opposite ends of the TP carbon nanotube layer 149 or on two opposite ends of the first substrate 120 by means of screen printing or spraying; and baking the first substrate 120 in an oven for 10-60 minutes at a temperature in a range from about 100° C. to about 120° C. to solidify the conductive silver paste. The two first electrodes 124 are electrically connected to the conductive layer 122.

In step (S30), the second electrode plate 14 includes the second substrate 140, the carbon nanotube composite layer and two second-electrodes 144. The carbon nanotube composite layer in the second electrode plate serves as the second conductive layer 142. The carbon nanotube films 141 can be laid on the second substrate 140 along a second direction. The first direction is crossed with the second direction.

Step (S40) includes the following steps of: (S401) applying an insulator 18 on the second electrode plate 14; (S402) placing the first electrode plate 12 on the insulator 18, wherein the carbon nanotube composite layer of the first electrode plate 12 is adjacent to the conductive layer of the second electrode plate 14; (S403) sealing the first electrode plate 12, the second electrode plate 14, and the insulator 18 with a sealant.

In step (S401), the insulator 18 can be made of, for example, insulative resin or any other insulative transparent material. The insulator 18 can be formed by coating a layer of insulative material on the edges of the second conductive layer 144 or the second substrate 140. It is understood that the insulator 18 could be placed on the conductive layer of the second electrode plate 14 or the first substrate 120.

In step (S402), the two first electrodes 124 in the first electrode plate 12 and the two second-electrodes 144 in the second electrode plate 12 are set at angles to each other. In step (S403), the sealant can be coated on the peripheries of the first electrode plate 12, the second electrode plate 14, and the insulator 18.

Furthermore, the method for making the touch panel 10 can further include the steps of: coating a layer of slurry comprising a plurality of dot spacers 16 on the portion of the surface of the first electrode plate 12 and/or the second electrode plate 14 having the conductive layer thereon; and drying the layer of slurry resulting in a plurality of dot spacers 16. The dot spacers 16 can be made of insulative resins or can be other insulative materials. Insulation between the first electrode plate 12 and the second electrode plate 14 is provided by the insulator 18 and the plurality of dot spacers 16. It is to be understood that the dot spacers 16 are optional, especially when the size of the touch panel 10 is relatively small.

In other embodiments, a continuous operation device configured for continuously preparing the electrode plate 12, and 14 can be adopted.

Method for Continuously Preparing the Electrode Plates

Figure 13:
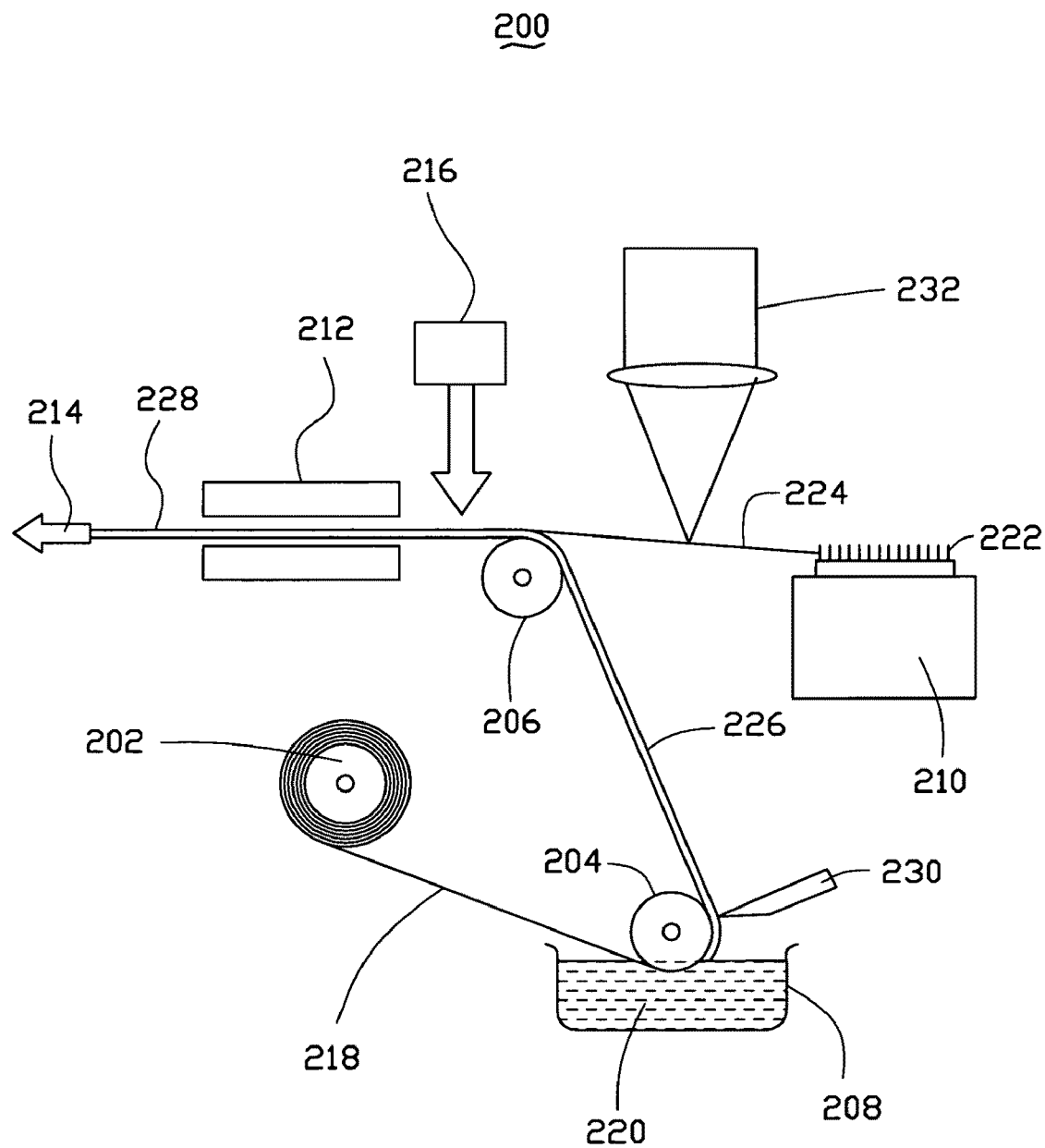
FIG. 13 shows a schematic view of a method for continuously making an electrode plate.

Referring to FIG. 13, the continuous operation device 200 includes a first shaft roller 202, a second shaft roller 204, a third shaft roller 206, a container 208, a platform 210, a tubular furnace 212, a traction device 214, an air knife 216, a removal device 230, and a laser 232. The first shaft roller 202, the second shaft roller 204, and the third shaft roller 206 are located separately and the axes thereof are along a same direction. The third shaft roller 206 and the traction device 214 are located on two ends of the tubular furnace 212. The air knife 216 is located between the third shaft roller 206 and the tubular furnace 212. The container 208 has an opening and is located below the second shaft roller 204, and part of the second shaft roller 204 is located in the container 208. The removal device 230 is adjacent to the second shaft roller 204 and a certain distance is formed between one end of the removal device 230 and the second shaft roller 204. A flexible substrate 218 is wound on the first shaft roller 202. The container 208 is filled with a polymer solution 220.

The method for making the first electrode plate and the second electrode plate using the continuous operation device includes the following steps of: (S220) passing the flexible substrate 218 around the second shaft roller 204, the third shaft roller 206 and the tubular furnace 212 in sequence to connect the flexible substrate 218 with the traction device 214 and forming a layer of polymer solution 226 on a surface of the flexible substrate 218; (S221) securing a carbon nanotube array 222 on the platform 210, drawing a drawn carbon nanotube film 224 from the carbon nanotube array 222 and adhering one surface of the drawn carbon nanotube film to the layer of polymer solution 226 on the surface of the flexible substrate 218; (S223) drawing the flexible substrate 218 with the layer of polymer solution 226 and the drawn carbon nanotube film 224 thereon by the traction device 214 at a certain speed along a direction parallel to the axis of the tubular furnace 212 to pass through the tubular furnace 212, thereby forming the carbon nanotube composite layer 228; and (S224) cutting the flexible substrate 218 with the carbon nanotube composite layer 228 thereon to form the electrode plate.

In step (S220), since part of the second shaft roller 204 is in the container 208, the polymer solution 220 in the container 208 can adhere on the surface of the flexible substrate 218 to form a layer of polymer solution 226. The removal device 230 maintains the thickness of the layer of polymer solution 226 on the substrate 218. The removal device can be a scrapper that is maintained a certain distance from the substrate 218.

In step (S221), the carbon nanotube array 222 can be a super-aligned carbon nanotube array. After the drawn carbon nanotube film 224 is drawn from the carbon nanotube array 222 and before the drawn carbon nanotube film 224 contacts with the layer of polymer solution 226, a laser device 232 can be used to irradiate the drawn carbon nanotube film 224 to increase the light transmittance of the drawn carbon nanotube film 224 as described above.

In step (S222), since the air knife 216 is located between the third shaft roller 206 and the tubular furnace 212, when the drawn carbon nanotube film passes below the air knife 216, wind produced by the air knife 216 applies a certain pressure to the drawn carbon nanotube film 224, the polymer solution 220 of the layer of polymer solution 226 infiltrates into the drawn carbon nanotube film 224. It is understood that any device that applies air pressure can be used in place of the air knife. The polymer solution 220 cures in the heat of the tubular furnace 212 when the flexible substrate with the drawn carbon nanotube film thereon passes therethrough. Thereby, the TP carbon nanotube composite layer 228 forms on the flexible substrate 218.

The above-described method can realize continuous production of the electrode plates 12, 14; which is conducive to making low-cost highly efficient touch panels.

Liquid Crystal Display Screen

Figure 14:
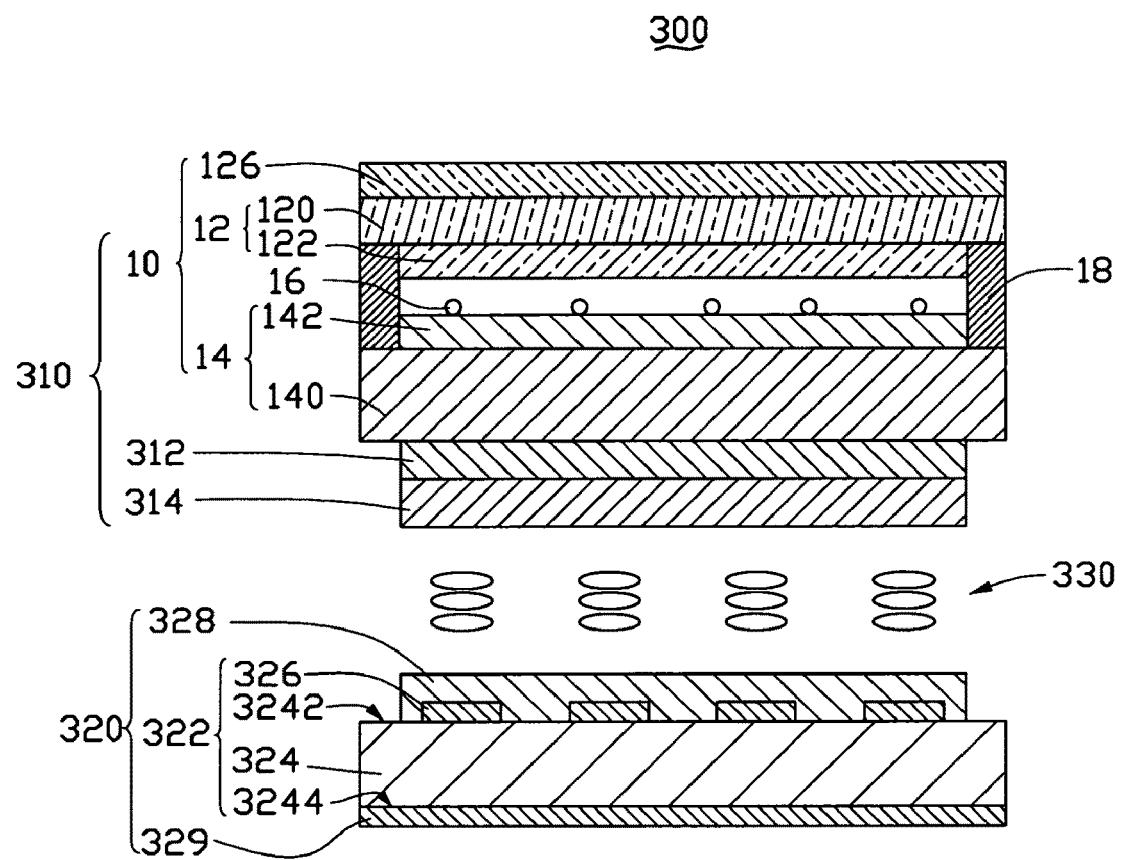
FIG. 14 shows a schematic view of a liquid crystal display with a touch panel.

Referring further to FIG. 14, one liquid crystal display screen 300 is provided and includes an upper component 310, a bottom component 320 opposite to the upper component 310, and a liquid crystal layer 330 located between the upper component 310 and the bottom component 320. The liquid crystal layer 330 includes a plurality of cigar shaped liquid crystal molecules. Understandably, the liquid crystal layer 330 can also be made of other conventional suitable materials, such as alkyl benzoic acid, alkyl cyclohexyl acid, alkyl cyclohexyl-phenol, phenyl cyclohexane, and so on. A thickness of the liquid crystal layer 330 ranges from about 1 micrometer to about 50 micrometers. In one embodiment, a thickness of the liquid crystal layer 330 is about 5 micrometers. The material of the liquid crystal layer 310 is phenyl cyclohexane.

The upper component 310 can include a touch panel (including any touch panel described herein), a first polarizer 312, and a first alignment layer 314 in sequence. In one embodiment, the touch panel is touch panel 10 described above. The first polarizer 312 is located between the touch panel 10 and the first alignment layer 314 and used to polarize light passing through the liquid crystal layer 330. A plurality of first grooves (not shown) parallel to each other are located on a surface of the first alignment layer 314. The plurality of first grooves is used to make the liquid crystal molecules align along a same direction. The first alignment layer 314 is adjacent to the liquid crystal layer 330.

A material of the first polarizer 312 can be conventional polarizing material, such as dichroism organic polymer materials. In some embodiments, the material of the first polarizer 312 can be iodine material or dyestuff material. The first polarizer 312 also can be an ordered carbon nanotube film having a plurality of carbon nanotubes are arranged along a same direction. The carbon nanotube film can be the drawn carbon nanotube film. A thickness of the first polarizer 312 can range from about 1 micrometer to about 0.5 millimeters.

Since the carbon nanotubes absorb electromagnetic waves like a black body, and the carbon nanotubes have uniform absorption ability anywhere in the electromagnetic spectrum, the carbon nanotube film also has a uniform polarization property throughout the electromagnetic spectrum. When the light beams are transmitted into the carbon nanotube film, some of the light beams parallel to the carbon nanotubes are absorbed by the carbon nanotube film, and the beams of light perpendicular to the carbon nanotubes are transmitted through the carbon nanotube film. The transmitted light is linearly polarized light. Thus the carbon nanotube film can be used as a polarizer. In some embodiments, the first polarizer 312 includes a plurality of carbon nanotubes arranged along a same direction, thus the first polarizer 312 has a good conductive property, and can be used as the upper electrode of the liquid crystal display screen 300. That is, the first polarizer 312 can act as both a polarizer and an upper electrode of the liquid crystal display screen 300 as can be see in FIG. 14.

Thus an upper electrode and the polarizer can be combined to acquire a liquid crystal display screen 300 having a low thickness, simple structure, and low cost. This can also enhance the efficiency of usage of an associated backlight since a layer therebetween can be eliminated.

Material of the first alignment layer 314 can be selected from a group consisting of polystyrenes and derivatives of the polystyrenes, polyimides, polyvinyl alcohols, polyesters, epoxy resins, polyurethanes, other polysilanes and CNTs. The first grooves of the first alignment layer 314 can be formed by a rubbing method, a tilt deposition method, or a micro-grooves treatment method, a SiOx-depositing method, and so on. In one embodiment, a material of the first alignment layer 314 is polyimide and a thickness thereof ranges from about 1 micrometer to about 50 micrometers.

It is to be understood that, in the drawn carbon nanotube film, the carbon nanotubes are aligned along the same direction and a groove can be formed by two adjacent carbon nanotubes. Thus, in another embodiment, the polarizer 312 made of drawn carbon nanotube film can be used as the first alignment layer 314, and thus the drawn carbon nanotube film will act as the alignment layer, the electrode and the polarizer. In other embodiments, the drawn carbon nanotube film is used as the alignment layer 314, while still employing a first polarizer 312. The drawn carbon nanotube films 141 are aligned along a same direction, and the carbon nanotubes in the first alignment layer 314 are aligned substantially along the same direction.

The bottom component 320 includes a second alignment layer 328, a thin film transistor panel 322, and a second polarizer 329 in sequence. The second alignment layer 328 is adjacent to the liquid crystal layer 330. The thin film transistor panel 322 is located between the second alignment layer 328 and the second polarizer 329. A plurality of second grooves (not shown) parallel to each other and perpendicular to the first grooves can be located on a surface of the second alignment layer 328 facing the liquid crystal layer 330.

Material of the second polarizer 329 can be conventional polarizing material, such as dichroism organic polymer materials. In some embodiments, the material of the first polarizer 110 can be iodine material or dyestuff material. A thickness of the second polarizer 329 ranges from about 1 micrometer to about 0.5 millimeters. The second polarizer 329 is used to polarize the light beams emitted from the light guide plate (not shown) located on the surface of the display screen 300 facing away from the thin film transistor panel 322, and thus acquire polarized light beams along a same direction. In one embodiment, the second polarizer 329 includes at least one layer of the drawn carbon nanotube film, the carbon nanotubes in the second polarizer 329 are substantially aligned along a same direction. In one embodiment, the first polarizer 312 and the second polarizer 329 both include a drawn carbon nanotube film, and the carbon nanotubes in the first polarizer 312 are perpendicular to the carbon nanotubes in the second polarizer 329.

The material of the second alignment layer 328 can be the same as that of the first alignment layer 314. An alignment direction of the first grooves is perpendicular to an alignment direction of the second grooves. The second grooves of the second alignment layer 328 are used to make the liquid crystal molecules align along a same direction. Since the alignment direction of the first grooves is perpendicular to the alignment direction of the second grooves, the alignment direction of the liquid crystal molecules differ by 90 degrees between the first alignment layer 314 and the second alignment layer 328 to play a role of shifting the light beams polarized by the second polarizer 329 90 degrees. In one embodiment, material of the second alignment layer 328 is polyimide and a thickness thereof ranges from about 1 micrometer to 50 micrometers. In another embodiment, the second alignment layer 328 can include at least one layer of the drawn carbon nanotube film as the above-described first alignment layer 314. The drawn carbon nanotube films 141 are aligned along a same direction, and the carbon nanotubes in the second alignment layer 328 are aligned substantially along the same direction. When the first and second alignment layers 314, 328 both include the drawn carbon nanotube films 141, the carbon nanotubes in the first alignment layer 314 are perpendicular to the carbon nanotubes in the second alignment layer 328.

In one embodiment, the aligned direction of the carbon nanotubes in the first alignment layer 314 is the same with the aligned direction of the carbon nanotubes in the first polarizer 312, and is defined as the third direction. The aligned direction of the carbon nanotubes in the second alignment layer 328 is the same with the aligned direction of the carbon nanotubes in the second polarizer 329, and is defined as the fourth direction. The third direction is perpendicular to the fourth direction. The third and forth direction may or my not correspond to the first and second directions.

Figure 15:
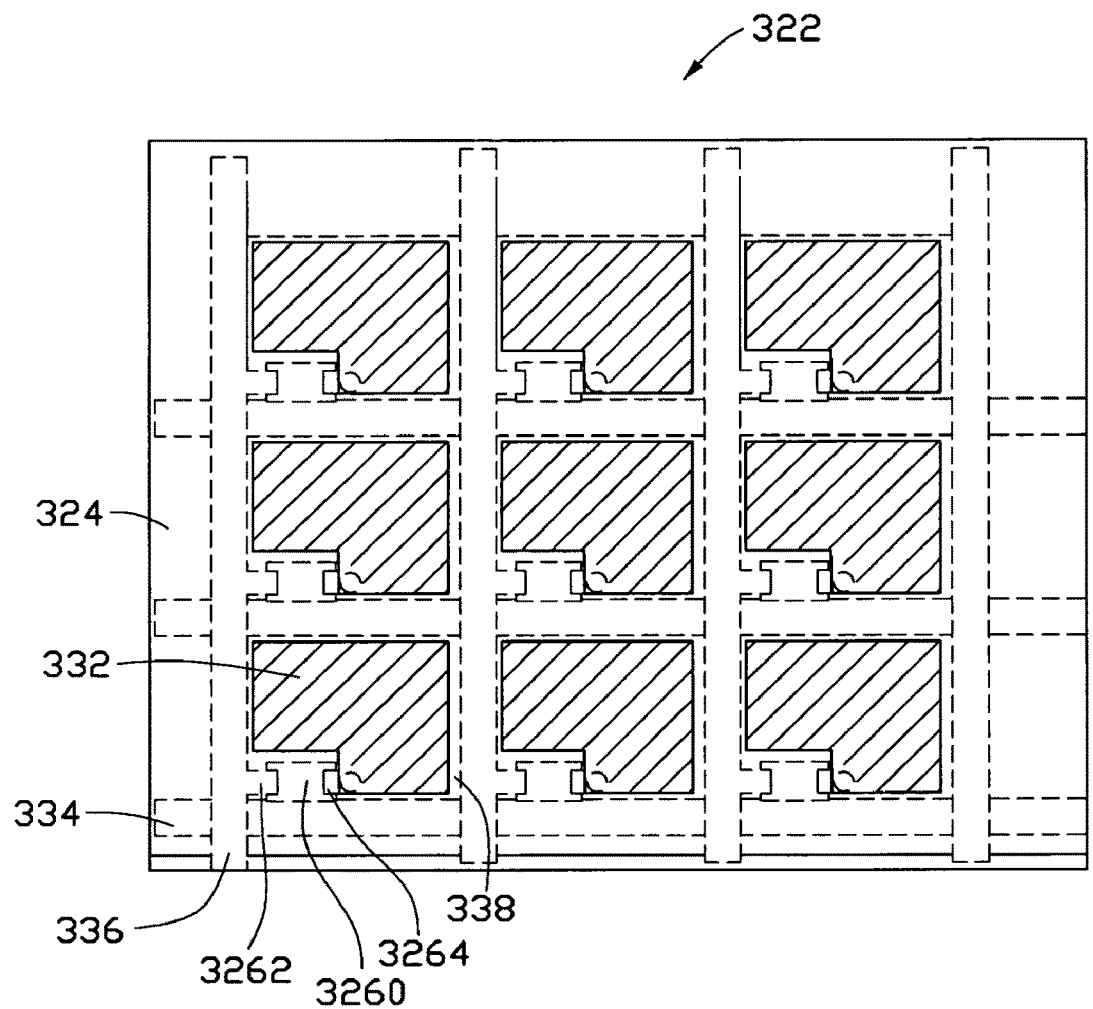
FIG. 15 shows a schematic view of a thin film transistor panel of the liquid crystal display screen.

Referring to FIG. 15, the thin film transistor panel 322 includes a third substrate 324 having a first surface 3242 and a second surface 3244, a plurality of thin film transistors 326 located on the first surface 3242 of the third substrate 324, a plurality of pixel electrodes 332, a plurality of gate lines 334, a plurality of source lines 336, and a display driver circuit (not shown). The plurality of thin film transistors 326 corresponds to the plurality of pixel electrodes 332. The plurality of thin film transistors 326 is connected to the display driver circuit by the gate lines 334 and source lines 336. The plurality of thin film transistors 326 and the plurality of the pixel electrodes 332 can be located on the first surface 3242 of the third substrate 324 in a matrix.

The thin film transistors 326, pixel electrodes 332, gate lines 334, and source lines 336 are located on the first surface 3242 of the third substrate 324. The gate lines 334 are spaced with each other and arranged parallel along an X direction. The source lines 336 are spaced with each other and arranged parallel along a Y direction. The X direction is perpendicular to the Y direction. Thus, the first surface 3242 of the third substrate 324 is divided into a matrix of grid regions 338. The pixel electrodes 332 and the thin film transistors 326 are separately located in the grid regions 338. The pixel electrodes 332 are spaced from each other. The thin film transistors 326 are spaced from each other. Each grid region 338 contains one thin film transistor 326 and one pixel electrode 332, and the pixel electrode 332 is electrically connected to a drain electrode 3264 of the thin film transistor 326. Each source electrode 3262 of the thin film transistor 326 is electrically connected to the source line 334. In some embodiments, the source electrodes 3262 of each line along the Y direction are electrically connected with one of the source lines 336 adjacent to the source electrodes 3262 of the corresponding line. Each gate electrode of the thin film transistors 326 are electrically connected with the gate lines 334. More specifically, the gate electrodes of each line along the X direction are electrically connected with one gate line 334 adjacent thereto.

The display driver circuit is electrically connected to the source lines 336 and the gate lines 334 to control the thin film transistors 326. The display driver circuit can be integrated on the third substrate 324 to form an integrated circuit board.

The pixel electrodes 332 are conductive films made of a conductive material. When the pixel electrodes 332 are used in the liquid crystal display screens, the materials of the pixel electrodes 332 can be selected from the group consisting of indium tin oxide (ITO), antimony tin oxide (ATO), indium zinc oxide (IZO), conductive polymer, and metallic carbon nanotubes. An area of each pixel electrodes 332 can be in a range from about 10 square micrometers to about 0.1 square millimeters. In one embodiment, the material of the pixel electrodes 332 is ITO, and the area thereof is about 0.05 square millimeters.

The materials of the source lines 336 or the gate lines 334 are conductive, and can be selected from the group consisting of metal, alloy, silver paste, conductive polymer, or metallic carbon nanotube wires. The metal or alloy can be selected from the group consisting of aluminum (Al), copper (Cu), tungsten (W), molybdenum (Mo), gold (Au), titanium (Ti), neodymium (Nd), palladium (Pd), cesium (Cs), and combinations thereof. A width of the source lines 336 and the gate lines 334 can be in the range from about 0.5 nanometers to about 100 micrometers. In one embodiment, the material of the source lines 336 and the gate lines 334 is Al, and the width of the source lines 336 and the gate lines 334 is about 10 micrometers.

Figure 16:
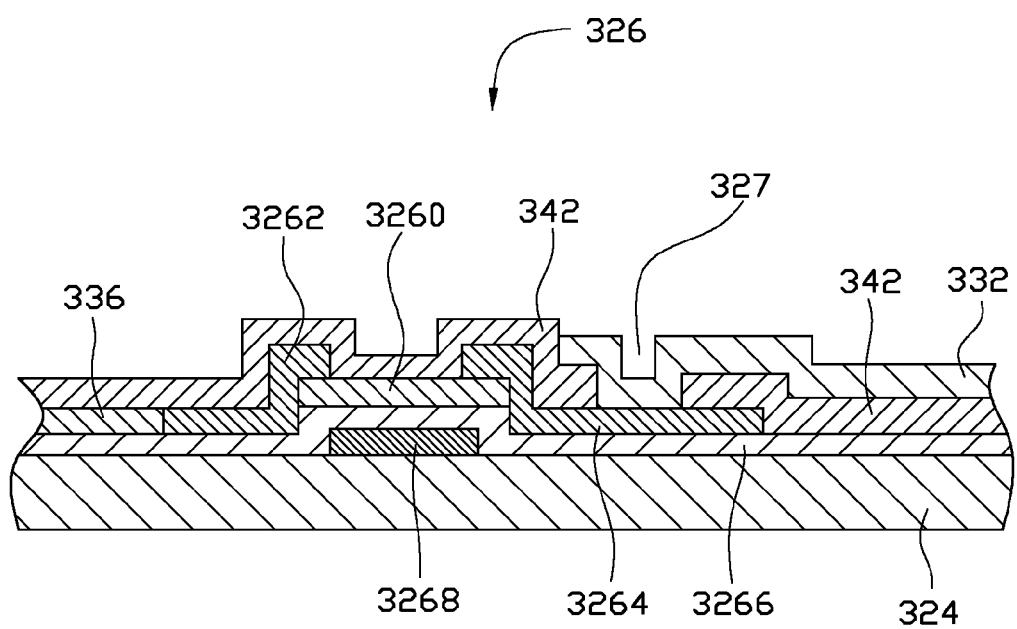
FIG. 16 is a cross sectional view of a thin film transistor.

The thin film transistor 326 can have a top gate structure or a bottom gate structure. Referring further to FIG. 16, in one embodiment, the thin film transistor 326 has a bottom gate structure and includes a semiconducting layer 3260, a source electrode 3262, a drain electrode 3264, an insulating layer 3266, and a gate electrode 3268.

A pixel insulating layer 342 can be further disposed on the thin film transistor 326. The pixel insulating layer 342 covers the thin film transistor 326 and defines a through hole 327 to expose the drain electrode 3264 of the thin film transistor 326. The pixel electrode 332 covers the entire grid region 338 and the thin film transistor 326 therein, and electrically connects to the drain electrode 3264 through the through hole 327. Other part of the thin film transistor 326 except the drain electrode 3264 is insulated from the pixel electrode 332 by the pixel insulating layer 342. The material of the pixel insulating layer 342 can be a rigid material such as silicon nitride (Si3N4) or silicon dioxide (SiO2), or a flexible material such as polyethylene terephthalate (PET), benzocyclobutenes (BCB), or acrylic resins.

The semiconducting layer 3260 is electrically connected to the source electrode 3262 and the drain electrode 3264. The gate electrode 3268 is insulated from the source electrode 3262 and the drain electrode 3264 by the insulating layer 3266. The gate electrode 3268 is located on the first surface 3242 of the third substrate 324. The insulating layer 3266 covers the gate electrode 3268. The semiconducting layer 3260 is located on the insulating layer 3266, and insulated from the gate electrode 3268 by the insulating layer 3266. The source electrode 3262 and the drain electrode 3264 are spaced apart from each other and located on the semiconducting layer 3260. The pixel electrode 332 is electrically connected with the drain electrode 3264 of the thin film transistor 326. Each source electrode 3262 of the thin film transistor 326 is electrically connected with one source line 336.

The thin film transistor 326 includes amorphous silicon-based thin film transistors, polysilicon-based thin film transistors, organic thin film transistors, zinc oxide-based thin film transistors, and CNT-based thin film transistors. In one embodiment, the thin film transistor 326 is a CNT-based thin film transistor, and the semiconducting layer 3260 thereof includes a TFT carbon nanotube layer. The TFT carbon nanotube layer is a semiconducting carbon nanotube layer. The TFT carbon nanotube layer includes a plurality of carbon nanotubes. The carbon nanotubes can be single-walled carbon nanotubes or double-walled carbon nanotubes. In one embodiment, diameters of the carbon nanotubes are less than 10 nanometers. The length of the semiconducting layer 3260 can range from about 1 micrometer to 100 micrometers, the width of the semiconducting layer 3260 can range from about 1 micrometer to 1 millimeter, and a thickness of the semiconducting layer 3260 can range from about 0.5 nanometers to 100 micrometers.

The TFT carbon nanotube layer includes one or more carbon nanotube films 141 described herein. The carbon nanotube film includes a plurality of carbon nanotubes, and the carbon nanotubes can be uniformly distributed therein. The carbon nanotubes in the TFT carbon nanotube layer are all semiconducting carbon nanotubes or at least a large part thereof are semiconducting carbon nanotubes. In one embodiment, the carbon nanotubes in the TFT carbon nanotube layer are all semiconducting carbon nanotubes.

Figure 17:
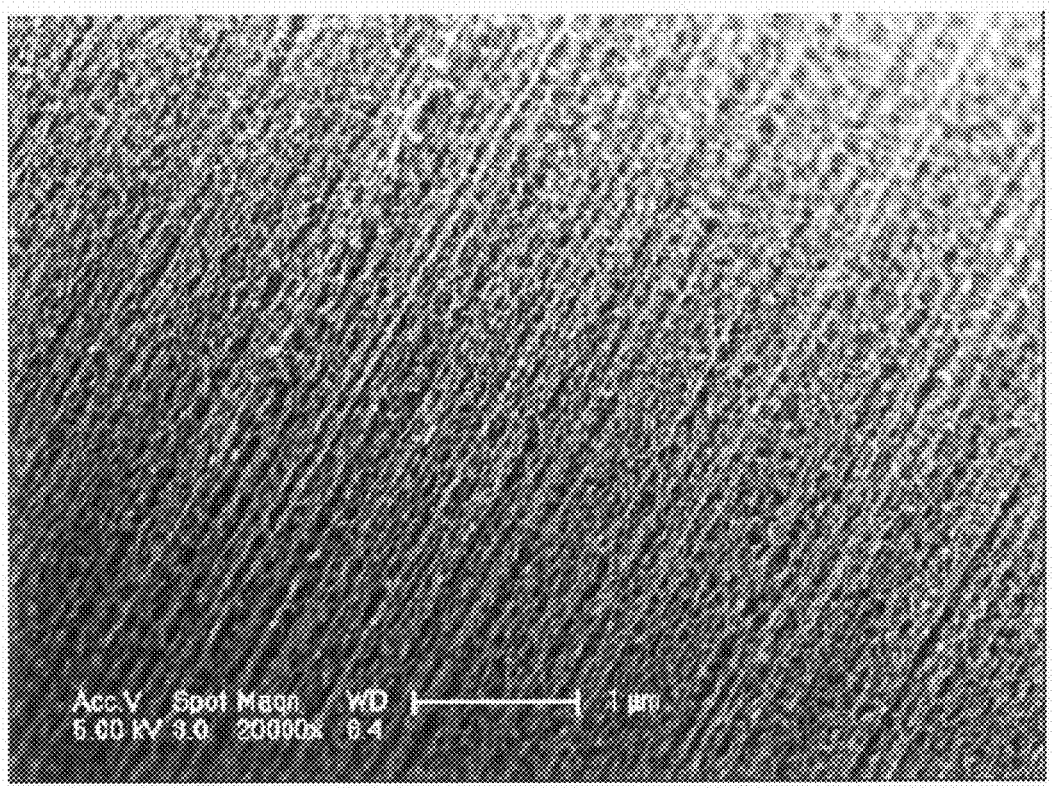
FIG. 17 shows an SEM image of a carbon nanotube film with the carbon nanotubes therein arranged side by side.

In one embodiment, the TFT carbon nanotube layer includes a carbon nanotube film having a plurality of carbon nanotubes. Referring to FIG. 17, the carbon nanotubes in the carbon nanotube film can be arranged along a preferred orientation extending from the source electrode 3262 to the drain electrode 3264. The carbon nanotubes are parallel with each other, generally equal in length and combined side by side with van der Waals attractive force therebetween. The length of the film can be equal to the lengths of the carbon nanotubes. In one embodiment, at least one carbon nanotube will span the entire length of the carbon nanotube film, a carbon nanotube segment film. The length of the carbon nanotube segment film is only limited by the lengths of the carbon nanotubes. In one embodiment, the length of the semiconducting layer 3260 is 50 micrometers, a width of the semiconducting layer 3260 is 300 micrometers, and a thickness of the semiconducting layer 3260 is 5 nanometers. A channel is defined in the semiconducting layer 3260 at a region between the source electrode 3262 and the drain electrode 3264. In one embodiment, the length of the channel is about 5 micrometers, a width of the channel ranges from about 40 micrometers to 100 micrometers. Each end of the carbon nanotubes are connected to the source electrode 3262 or the drain electrode 3264.

Since the carbon nanotubes in the semiconducting layer 3260 are arranged along the preferred direction extending from the source electrode 3262 to the drain electrode 3264 and the semiconducting carbon nanotubes have excellent semiconducting properties, the paths for the carriers to travel in the semiconducting layer 3260 are minimum, and the carrier mobility of the thin film transistor 326 is relatively high. Because of this, it is possible to enhance the display characteristic of the liquid crystal display screen, such as response speed.

The thin film transistor panel 322 is used as a pixel drive element for each of the pixel points. The pixel point is an image unit of the liquid crystal display screen 300 and a plurality of image units can form an image displaying on the liquid crystal display screen 300. When the first polarizer 312 is used as the upper electrode of the liquid crystal display screen 300, and a voltage is applied to the pixel electrodes and the first polarizer 312, the liquid crystal molecules in the liquid crystal layer 330 between the first alignment layer 312 and the second alignment layer 328 align along a same direction to make the light beams polarized by the second polarizer 329 irradiate on the first polarizer 312 directly without rotation, and the polarized light beams cannot pass through the first polarizer 312. Without a voltage applied to the pixel electrode and the first polarizer 312, the polarized light beams rotated by the liquid crystal molecules can pass through the first polarizer 312.

Figure 18:
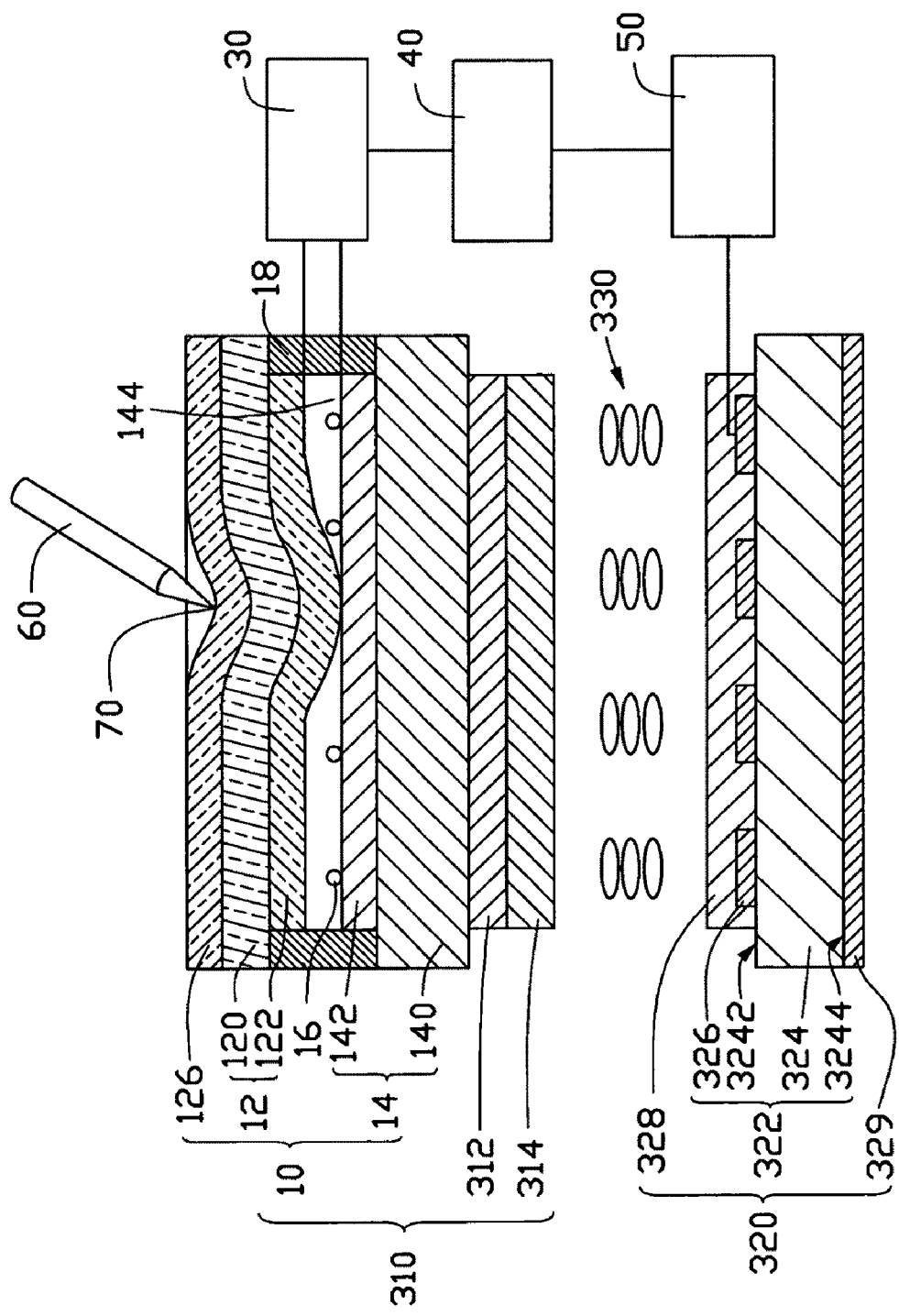
FIG. 18 is essentially a schematic cross-sectional view of the liquid crystal display screen with a touch panel, showing operation with a touch tool.

Referring to an embodiment shown in FIG. 18, the liquid crystal display screen 300 further includes the first controller 30, the central processing unit (CPU) 40, and the second controller 50. The first controller 30, the CPU 40, and the second controller 50 are electrically interconnected. The touch panel 302 is connected to the first controller 30 by an external circuit. The second controller 50 is electrically connected to the display driver circuit of the thin film transistor panel 322 of the bottom component 320.

In operation, a voltage of 5V is applied to each of the two first-electrodes 124 of the first electrode plate 12 and to each of the two second-electrodes 144 of the second electrode plate 14. A user operates the display by pressing the first electrode plate 12 of the touch panel 10 with a finger, a pen/stylus 60, or the like while visually observing the display of the liquid crystal display screen 300 through the touch panel 10. This pressing causes a deformation of the first electrode plate 12. The deformation of the first electrode plate 12 causes a connection between the first conductive layer 122 and the second conductive layer 142 at a touch point 70. Voltage changes in the first direction of the first conductive layer 122 and the second direction of the second conductive layer 142 can be detected by the first controller 30. Then the first controller 30 transforms the voltage changes into coordinates of the touch point 70, and sends the coordinates of the touch point 70 to the CPU 40. The CPU 40 then sends out commands according to the coordinates of the touch point 70 and further controls the display driver circuit of the thin film transistor panel 322 of the bottom component 320.

Method for Making Liquid Crystal Display Screen

Referring to FIG. 19, a method for making the liquid crystal display screen 300, according to one embodiment, includes the following steps of: (S60) preparing an upper component 310 comprising a touch panel 10, a first polarizer 312, and a first alignment layer 314; (S70) preparing a bottom component 320 comprising a second alignment layer 328, a thin film transistor panel 322, and a second polarizer 329; and (S80) placing a liquid crystal layer 330 between the first alignment layer 314 of the upper component 310 and the second alignment layer 328 of the bottom component 320.

Figure 20:
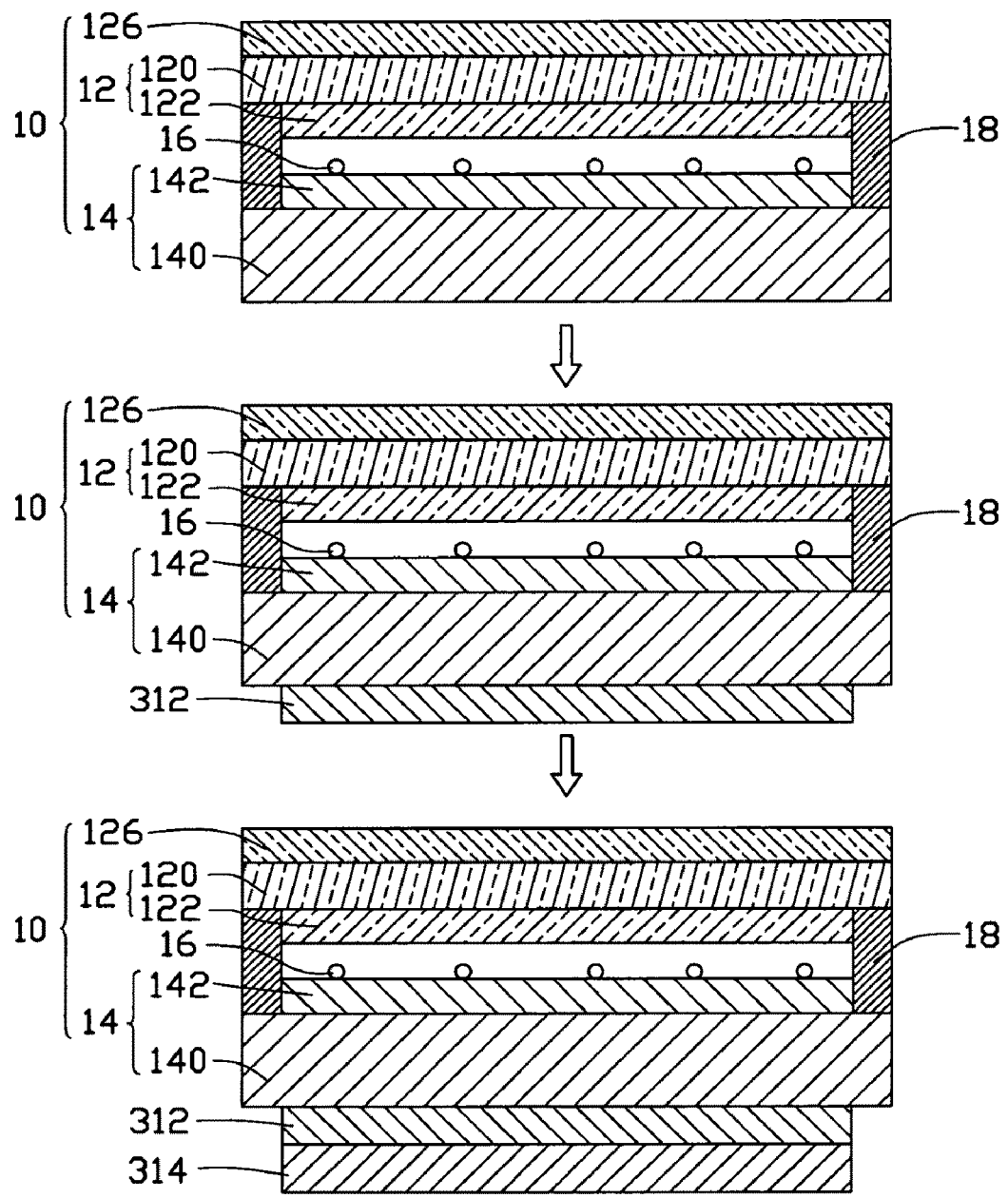
FIG. 20 shows a schematic view of a method for making the upper component.

Referring to FIG. 20, step (S60) can further include the following steps of: (S601) preparing the touch panel 10; (S602) forming a first polarizer 312 on a surface of the touch panel 302; and (S603) forming a first alignment layer 314 on a surface of the first polarizer 312.

In step (S602), the first polarizer 312 is located on the second surface 1404 of the second substrate 140. In some embodiments, the polarizer 312 includes a TP carbon nanotube layer 149 and/or a TP carbon nanotube composite layer. The polarizer 312 will include a plurality of drawn carbon nanotube films 141 coplanar and/or stacked with each other. The carbon nanotubes in the plurality of drawn carbon nanotube films 141 are arranged along a same direction. A thickness of the first polarizer 312 ranges from about 100 micrometer to about 0.5 millimeters.

Step (S603) can be executed by a method including a screen printing method or a spraying method. In one embodiment, the first alignment layer 314 is formed by spraying a layer of polyimide on the surface of the first polarizer 312 facing away from the touch panel 302. The first alignment layer 314 can include a plurality of first grooves formed thereon. The first grooves of the first alignment layer 314 can be formed by a rubbing method, a tilt deposition method, or a micro-grooves treatment method, and so on. Step (S603) can be optional.

Figure 21:
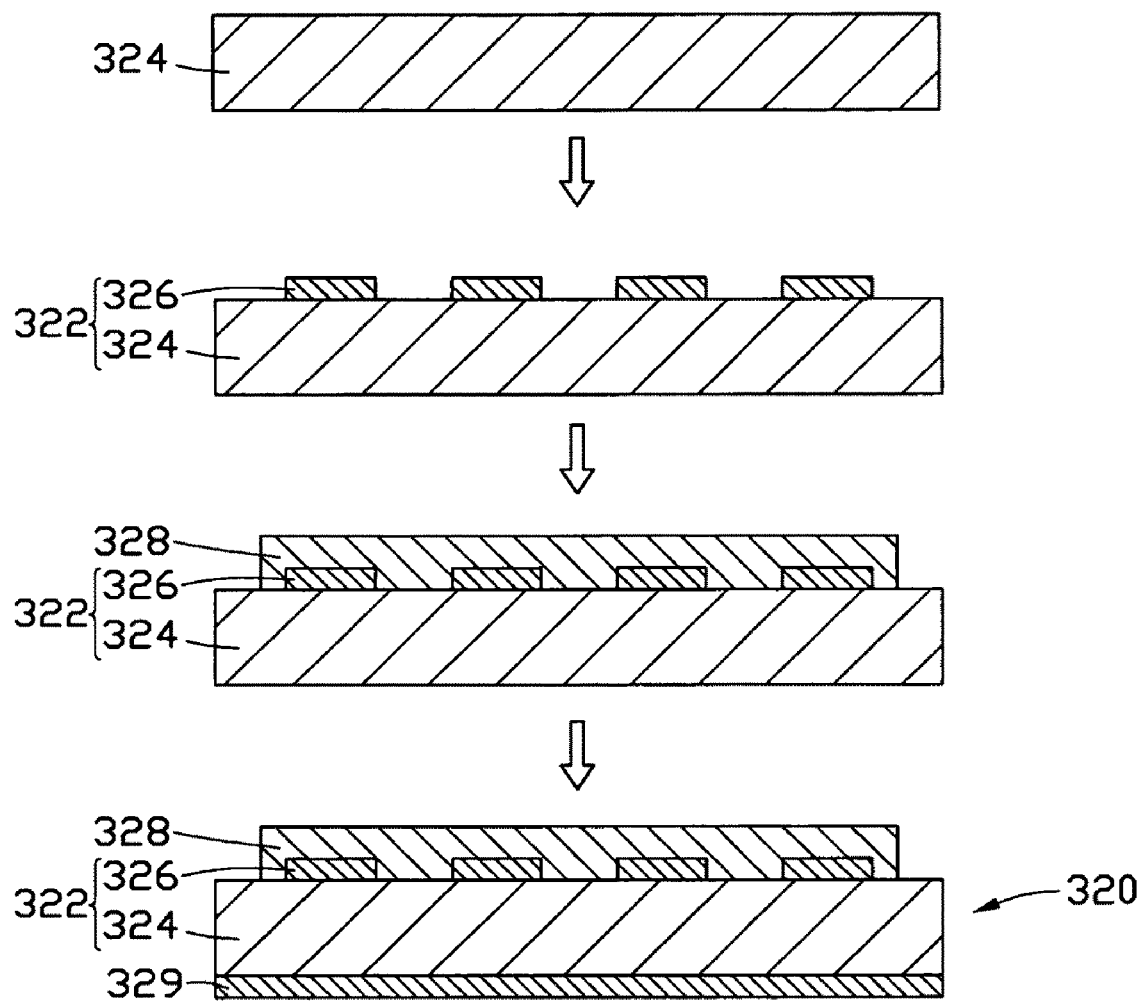
FIG. 21 shows a schematic view of a method for making the bottom plate, in accordance with one embodiment.

Referring to FIG. 21, step (S70) can include the following steps of: (S701) preparing a thin film transistor panel 322, the thin film transistor panel 322 includes a third substrate 324 having the first surface 3242 and the second surface 3244, and a plurality of thin film transistors 326 located on the first surface 3242 of the third substrate 324; (S702) applying a second alignment layer 328 covering the thin film transistors 326 of the thin film transistor panel 322; and (S703) placing a second polarizer 329 on the second surface 3244 of the third substrate 324 of the thin film transistor panel 322.

In step (S701), each thin film transistor 326 includes a semiconducting layer with a plurality of carbon nanotubes therein. The size and the material of the third substrate 324 can be the same as that of the second substrate 140. The thin film transistor array 326 can include amorphous silicon-based thin film transistors, polysilicon-based thin film transistors, organic thin film transistors, or zinc oxide-based thin film transistors. The method for forming the thin film transistor can be selected from among known conventional methods. In one embodiment, the thin film transistor array 326 includes carbon nanotube based thin film transistors.

Figure 22:
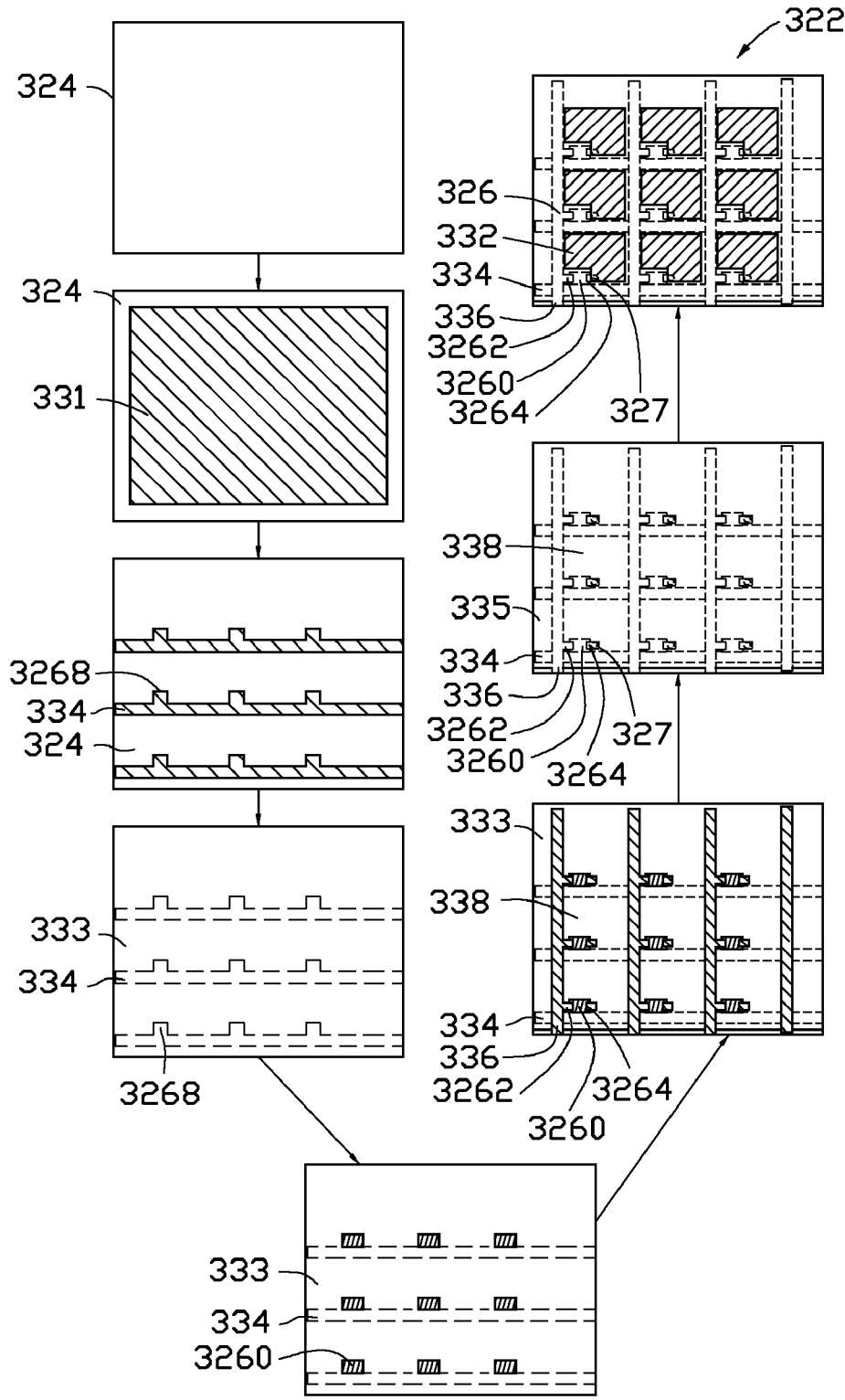
FIG. 22 shows a schematic view of a method for making the thin film transistor panel.

When the thin film transistor array 326 includes carbon nanotube based thin film transistors, the thin film transistor panel 322 can be prepared by the following steps. Referring to FIG. 22, firstly, the third substrate 324 is supplied and a conductive layer 331 is formed on the first surface 3242 of the third substrate 324 and the conductive layer 331 is then patterned to form a plurality of gate lines 334, and a plurality of gate electrodes 3268. Secondly, a first insulating layer 333 is formed to cover the gate lines 334 and the gate electrodes 3268. Thirdly, a plurality of semiconducting layers 3260 are formed on a surface of the first insulating layer 333. Fourthly, a plurality of source lines 336 parallel with each other and are spaced for a certain distance are formed, and adjacent two source lines 336 and adjacent two gate lines 334 constitute a grid region 338. The source electrode 3262 and the drain electrode 3264 are then separately formed on each semiconducting layer 3260, and each source electrode 3262 is electrically connected to the corresponding source line 336. Fifthly, a second insulating layer 335 covers the source lines 336, the source electrodes 3262, the drain electrodes 3264 and the semiconducting layers 3260. Then, a plurality of through holes 327 are formed in the insulating layer 335. Finally, pixel electrodes 332 are formed and the pixel electrode 332 is electrically connected to the drain electrode 3264 in each grid region 338.

In the first step, the size and/or the material of the third substrate 324 can be the same as that of the second substrate 140. In the third step, each semiconducting layer 3260 corresponds to a gate electrode 3268.

The materials of the gate lines 334 and the gate electrodes 3268 are conductive, and can be selected from the group consisting of metal, alloy, ITO, ATO, silver paste, conductive polymer, or metallic carbon nanotubes. The metal or alloy can be selected from the group consisting of aluminum (Al), copper (Cu), tungsten (W), molybdenum (Mo), gold (Au), titanium (Ti), neodymium (Nd), palladium (Pd), cesium (Cs), and combinations thereof. The methods for making the gate lines 334 and the gate electrodes 3268 vary according to the kinds of the material used. When the material of the gate lines 334 and the gate electrodes 3368 is metal, alloy, ITO or ATO, the method for forming the gate lines 334 and the gate electrodes 3368 can be an evaporation method, a sputtering method, a deposition method, a masking method or an etching method. When the material of the gate lines 334 and the gate electrodes 3368 is silver paste, conductive polymer, or metallic carbon nanotubes, the gate lines 334 and the gate electrodes 3268 can be printed or adhered directly on the first surface of the third substrate 324. The thickness of the gate lines 334 and the gate electrodes 3268 can range from about 0.5 nanometers to about 100 micrometers. In one embodiment, the material of the conductive layer 331 is metal, and the method for forming the gate lines 334 and the gate electrodes 3268 includes a deposition method, a masking method and an etching method.

In a second step, a material of the first insulating layer 333 can be a rigid material, such as silicon nitride or silicon oxide, or a flexible material, such as benzocyclobutene (BCB), polyester or acrylic resin. The method for forming the first insulating layer 333 can include a deposition method or a printing method. A thickness of the first insulating layer 333 can range from about 0.5 nanometers to about 100 micrometers. In one embodiment, the material of the first insulating layer 333 is silicon nitride, the first insulating layer 333 is formed by a plasma chemical vapor deposition method, and a thickness of the first insulating layer 333 is about 1 micrometer.

A third step can include the following steps of: supplying at least one carbon nanotube film including a plurality of carbon nanotubes arranged along a same direction; placing the at least one carbon nanotube film on the surface of the first insulating layer 333 to form a carbon nanotube layer; and patterning the carbon nanotube layer to form a plurality of semiconducting layers 3260. When the semiconducting layers 3260 have an almost same size as the carbon nanotube film, each carbon nanotube film can be patterned to form one semiconducting layer 3260. When the size of the carbon nanotube film is larger than the semiconducting layers 3260, each carbon nanotube film can be patterned to form two or more semiconducting layers 3260. The method for patterning includes an etching method. In one embodiment, the carbon nanotube film includes a plurality of carbon nanotubes arranged along a same direction. The carbon nanotubes are parallel to the surface of the carbon nanotube film. The carbon nanotube film can include one or more carbon nanotube segments. The carbon nanotubes in the carbon nanotube segment are parallel with each other, have almost equal lengths and are combined side by side by van der Waals attractive force therebetween. The length of the carbon nanotube film can be equal to the length of the carbon nanotubes. Such that at least one carbon nanotube will span the entire length of the carbon nanotube film (e.g. a carbon nanotube segment film). The length of the carbon nanotube film is only limited by the length of the carbon nanotubes. The carbon nanotubes can be selected from a group consisting of single-walled carbon nanotubes, double-walled carbon nanotubes or combination thereof. A diameter of the carbon nanotubes ranges from about 0.5 nanometers to 10 nanometers. Each of the one or more carbon nanotube segments can correspond to one of the semiconducting layer 3260. When the size of the carbon nanotube segment is larger than the semiconducting layers 3260, each carbon nanotube segment can be patterned, such as by etching, to form two or more semiconducting layer 3260.

The method for patterning the carbon nanotube layer to form a plurality of semiconducting layers 3260 can include a laser etching method or a plasma etching method.

In a fourth step, the material of the source lines 336, the source electrode 3262 and the drain electrode 3264 and the method for making the source lines 336, the source electrode 3262 and the drain electrode 3264 can be the same as that of the gate lines 334 and the gate electrodes 3268. When the semiconducting layer 3260 includes a plurality of carbon nanotubes arranged along a same direction, the carbon nanotubes extend from the source electrodes 3262 to the drain electrodes 3264.

It can be understood that to acquire the semiconducting layer 3260 having a better semiconducting property, a step of eliminating the metallic carbon nanotubes in the carbon nanotube layer 3260 can be further provided. In one embodiment, a voltage is applied between the source electrode 3262 and the drain electrode 3264, to break down the metallic carbon nanotubes in the carbon nanotube layer, thus a semiconducting layer 3260 free of metallic carbon nanotubes therein is achieved. The voltage is in a range from about 1 to about 1000 volts (V). In other embodiments, the carbon nanotube layer can be irradiated with a hydrogen plasma, microwave, terahertz (THz), infrared (IR), ultraviolet (UV), or visible light (Vis), to break down the metallic carbon nanotubes in the carbon nanotube layer, to achieve a semiconducting layer 360 free of metallic carbon nanotubes therein.

In a fifth step, a material, a thickness and a method for forming the second insulating layer 335 can be the same as that of the first insulating layer 333. The method for forming the through holes 327 can be done by an etching method or an ion bombardment method. Because the second insulating layer 335 at the through hole 327 is eliminated, a conductive channel for the drain electrode 3264 communicating with external space can be formed by the through hole 327.

The pixel electrodes 332 are conductive films and can be selected from a group consisting of indium tin oxide (ITO) layers, antimony tin oxide (ATO) layer, indium zinc oxide (IZO) layers or metallic carbon nanotube layers, and other transparent layers. The area of the pixel electrodes 332 is smaller than that of the grid region 338. The pixel electrodes 332 are electrically connected to the drain electrodes 3264. The area of the pixel electrodes 332 can range from about 10 square micrometers to about 0.1 square millimeters. In one embodiment, the material of the pixel electrodes 332 is ITO, and the area thereof is about 0.05 square millimeters.

A method for making the pixel electrodes 332 includes the following steps of: forming a conducting layer (not shown) on the surface of the second insulating layer 335 on the third substrate 324; etching the conducting layer to form the pixel electrodes 332 in the grid regions 338; and making the pixel electrodes 332 electrically connected to the drain electrodes 3264 by the through holes 327. The method for etching the conducting layer can include a laser etching method, a plasma etching method, and other methods.

The method for forming the conductive layer can include an evaporation method, a sputtering method, or a deposition method. During the process of forming the conductive layer, the through holes 327 are filled with the material of the conductive layer. Thus, the drain electrode 3264 is electrically connected to the conductive layer, and after etching, the drain electrode 3264 is electrically connected to the pixel electrodes 332.

Step (S702) can be executed by the same methods for applying the first alignment layer 314 on the first polarizer 312. Step (S702) is optional.

Both step (S603) and step (S702) can be optional. Also step (S80) can comprise of placing a liquid crystal layer between the first polarizer 312 and the plurality of thin film transistors.

In step (S703), the second polarizer 329 can be conventional polarizing material, such as dichroism organic polymer materials. In some embodiments, the material of the first polarizer 110 can be iodine material or dyestuff material. The second polarizer 329 can be placed on the second surface of the third substrate 324 by a transparent adhesive. A polarization direction of the polarized light beams passing through the second polarizer 329 is perpendicular to that passing through the first polarizer 312. A thickness of the second polarizer 329 ranges from about 1 micrometer to about 0.5 millimeters. When a polarized light is utilized, the second polarizer 329 can be omitted.

Step (S80) can be executed by the following steps of: applying the liquid crystal material on the surface of the first alignment layer 314 of the upper component 310 or the second alignment layer 328 of the bottom component 320; locating the other alignment layer adjacent to the liquid crystal layer 330; and securing the upper component 310 and the bottom component 320. In one embodiment, a drop-tube is used to supply the liquid crystal material. The liquid crystal layer 330 can include a plurality of cigar shaped liquid crystal molecules. The alignment direction of the first grooves is perpendicular to that of the second grooves. The silicon sulfide rubber can be use to coat on the edge of the upper component 310 and the bottom component 320.

Step (S80) also can be executed by the following steps of: placing the upper component 310 and the bottom component 320 spaced and parallel with each other, the first alignment layer 314 is opposite to the second alignment layer 328; sealing the edges of the upper component 310 and the bottom component 320; and supplying an amount of liquid crystal material between the upper component 310 and the bottom component 320 through a small hole.

Further, in order to maintain enough spacing between the upper component 310 and the bottom component 320, a plurality of spacers (not shown) is placed therebetween. The size and the material of the spacers can be selected based on users' specific needs. In one embodiment, a plurality of polyethylene (PE) balls are dispersed in the ethanol, and the ethanol containing the PE balls are put between the upper component 310 and the bottom component 320. After the ethanol has evaporated, the PE balls between the upper component 310 and the bottom component 320 are used as the spacers. The diameter of the PE balls can range from about 1 to about 10 micrometers.

The liquid crystal display screen 300 can be used in electronic apparatuses, such as personal computer systems (e.g., desktops, laptops, tablets or handhelds). The electronic apparatuses may also correspond to public computer systems such as information kiosks, automated teller machines (ATM), point of sale machines (POS), industrial machines, gaming machines, arcade machines, vending machines, airline e-ticket terminals, restaurant reservation terminals, customer service stations, library terminals, learning devices, and the like. The CPU of the electronic apparatuses and the CPU 40 of the liquid crystal display screen 300 can be integrated.

Further, to keep the distance from the upper component 310 to the bottom component 320, a plurality of spacers (not shown) can be located between the upper component 310 and the bottom component 320 when the liquid crystal display screen had a large scale. In one embodiment, a diameter of the spacers is in the range from about 1 micron to about 10 microns.

It is to be understood that the liquid crystal display screen 300 can further include other elements such as color filters, black matrix, backlight unit, TFT driving circuit unit, and so on. The color filters are located below the first polarizer 312 for providing different color of lights. The black matrix is formed on the lower surface of the second substrate 140. The backlight unit is located below the second polarizer 329 for providing light. The display driver circuit is connected to the TFTs for driving the TFT panel 322. The black matrix may be located on the lower surface of the second substrate 140 in a matrix arrangement. The black matrix may divide the surface of the second substrate 140 into a plurality of cell areas where the color filters are to be formed and to prevent light interference between adjacent cells. The color filter may include red, green, and blue tricolors.

It is to be understood that the bottom component can further include a carbon nanotube layer configured for both polarizing light and aligning liquid crystals. The carbon nanotube layer comprises a plurality of carbon nanotubes substantially arranged along a primary direction.

It is to be understood that there are two kinds of carbon nanotubes metallic carbon nanotubes and semiconducting carbon nanotubes. The type is determined by the arrangement of the carbon atoms therein. The carbon nanotube structure or carbon nanotube film may contain both kinds of the carbon nanotubes. In the present application, only in the semiconducting layers 3260, almost all or at least a large part of the carbon nanotubes are semiconducting carbon nanotubes. In other elements that including carbon nanotubes of the touch panel and the liquid crystal display screen, the majority of the carbon nanotubes are metallic carbon nanotubes.

The touch panels and the liquid crystal display screens can have at many advantages. Firstly, because the carbon nanotube film or the carbon nanotube composite film has superior toughness, high mechanical strength, and uniform conductivity, the touch panel and the liquid crystal display screen using the same adopting the carbon nanotube film or the carbon nanotube composite film are durable. Secondly, a flexible touch panel and a flexible liquid crystal display screen can be acquired by combining the carbon nanotube film or the carbon nanotube composite film with a flexible substrate. Thirdly, since the carbon nanotubes have excellent electricity conductive property, a carbon nanotube film formed by a plurality of carbon nanotubes uniformly distributed therein, has a uniform resistance distribution; and thus the touch panel and the liquid crystal display screen using the same have an improved sensitivity and accuracy. Fourthly, carbon nanotube films can have a high transparency, thereby promoting improved brightness of the touch panel and the liquid crystal display screen using the same. Fifthly, the pulling method for fabricating the carbon nanotube film is simple, and the adhesive carbon nanotube film can be located directly on the substrate. As such, the method for fabricating a drawn carbon nanotube film is suitable for the mass production of touch panels and display device using the same and reduces the cost thereof.

It is also to be understood that above description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the invention as claimed. Any element discussed with any embodiment is envisioned to be able to be used with the other embodiments. The above-described embodiments illustrate the scope of the disclosure but do not restrict the scope of the disclosure.

What is claimed is:

1. A method for making a liquid crystal display screen, the method comprising the following steps of:
preparing a touch panel and a thin film transistor panel, wherein the thin film transistor panel comprises a plurality of thin film transistors, each of the thin film transistors comprises a TFT carbon nanotube layer;

applying a first polarizer on a surface of the touch panel; and placing a liquid crystal layer between the first polarizer and the thin film transistor panel, wherein the touch panel comprises a first and a second TP carbon nanotube layer, the first TP carbon nanotube layer comprises at least one first carbon nanotube film, the second TP carbon nanotube layer comprises at least one second carbon nanotube film, and the touch panel is prepared by following steps of:

forming a first and a second electrode plate, wherein forming the first electrode plate comprises:

supplying a first substrate and the at least one first carbon nanotube film;

treating the at least one first carbon nanotube film by a laser to improve the transparency of the at least one first carbon nanotube film;

laying the at least one first carbon nanotube film on the first substrate thereby forming a first conductive layer on the first substrate;

applying an organic solvent on the at least one first carbon nanotube film to treat the at least one first carbon nanotube film; and connecting two first electrodes to the first conductive layer; and forming the second electrode plate comprises:

supplying a second substrate and at least one second carbon nanotube film;

treating the at least one second carbon nanotube film by a laser to improve the transparency of the at least one second carbon nanotube film;

laying the at least one second carbon nanotube film on the second substrate thereby forming a second conductive layer on the second substrate;

applying an organic solvent on the at least one second carbon nanotube film; and connecting two second electrodes to the second conductive layer; and assembling the first electrode plate and the second electrode plate together having a space between the first substrate and the second substrate.

2. The method of claim 1, wherein the organic solvent is applied on the at least one first or second carbon nanotube film by applying the organic solvent on a surface of the at least one first or second carbon nanotube film or placing the at least one first or second carbon nanotube film into a container filled with the organic solvent.

3. The method of claim 1, further comprising steps of:
infiltrating a polymer solution into the at least one first or second carbon nanotube film; and
curing the polymer solution to form a TP carbon nanotube composite layer on the first or second substrate.

4. The method of claim 3, wherein infiltrating the polymer solution into the at least one first or second carbon nanotube film comprises the steps of:
coating a layer of polymer solution on the first or second substrate; and
placing the at least one first or second carbon nanotube film on the layer of polymer solution on the first or second substrate.

5. The method of claim 1, wherein the at least one first carbon nanotube film is laid on the first substrate along a first direction and the at least one second carbon nanotube film is laid on the second substrate along a second direction, wherein the first direction intersects with the second direction.

6. The method of claim 1, wherein the two first electrodes in the first electrode plate and the two second electrode in the second electrode plate are set at angles to each other.

7. The method of claim 1, further comprising steps of:
applying an insulator on the second electrode plate;
placing the first electrode plate on the insulator; and
sealing the first electrode plate, the second electrode plate, and the insulating layer with a sealant, wherein the first conductive layer faces to the second conductive layer.

8. The method of claim 7, further comprising steps of:
applying a slurry comprising a plurality of dot spacers on at least one of the first and second conductive layers; and
drying the slurry resulting in a plurality of dot spacers between the first electrode plate and the second electrode plate.

9. The method of claim 1, further comprising steps of applying a first and a second alignment layer; wherein the first alignment layer is applied on the first polarizer; and the second alignment layer is applied on the plurality of thin film transistors, the liquid crystal layer being placed between the first alignment layer and the second alignment layer.

10. The method of claim 1, further comprising a step of placing a second polarizer on a surface of the thin film transistor panel.

11. The method of claim 10, wherein the second polarizer comprises a plurality of carbon nanotubes substantially aligned along a same direction, the first polarizer comprises a plurality of carbon nanotubes substantially aligned along a same direction, and the aligned direction of the carbon nanotubes in the second polarizer is perpendicular to that of the carbon nanotubes in the first polarizer.

12. The method of claim 1, wherein the thin film transistor panel is prepared by the following substeps of:
supplying a third substrate; and
forming a plurality of gate lines and a plurality of gate electrodes and a first insulating layer to cover the gate lines and the gate electrodes;
applying a plurality of TFT carbon nanotube layers on a surface of the first insulating layer, each of the plurality of TFT carbon nanotube layers is corresponding to one of the gate electrodes;
creating a plurality of source lines parallel to each other and spaced by a distance, adjacent two gate lines and adjacent two source lines constitute a grid region, wherein a source electrode and a drain electrode are separately formed on each of the plurality of TFT carbon nanotube layers, and each source electrode is electrically connected to the corresponding gate line in each grid region, each of the plurality of TFT carbon nanotube layers comprises a plurality of carbon nanotubes arranged along a same direction from the source electrode to the drain electrode;
affixing a second insulating layer covering the source lines, the source electrodes, the drain electrodes and the TFT carbon nanotube layers, and forming a plurality of through holes in the second insulating layer corresponding to the drain electrodes; and
constructing a plurality of pixel electrodes, each of the plurality of pixel electrodes is electrically connected to the drain electrode in each grid region.

13. The method of claim 12, wherein the source lines are parallel to each other and spaced by a distance.

14. The method of claim 12, wherein the step of forming the plurality of TFT carbon nanotube layers on the first insulating layer comprises the following steps of:

supplying at least one third carbon nanotube film comprising of a plurality of carbon nanotubes arranged along a same direction;

placing the at least one third carbon nanotube film on the surface of the first insulating layer; and patterning the at least one third carbon nanotube film.

15. The method of claim 12, further comprising a step of eliminating metallic carbon nanotubes in the TFT carbon nanotube layer, and the step is executed by a method of applying a voltage between the source electrode and the drain electrode or irradiating the TFT carbon nanotube layer with a hydrogen plasma, microwave, terahertz, infrared, ultraviolet, or visible light.

* * * * *